United States Patent
Hayashi

(10) Patent No.: US 8,981,356 B2
(45) Date of Patent: Mar. 17, 2015

(54) MOLECULAR MEMORY

(71) Applicant: Kabushiki Kaisha Toshiba, Tokyo (JP)

(72) Inventor: Tetsuya Hayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/785,772

(22) Filed: Mar. 5, 2013

(65) Prior Publication Data

US 2013/0328023 A1    Dec. 12, 2013

(30) Foreign Application Priority Data

Jun. 7, 2012    (JP) ................................. 2012-130060

(51) Int. Cl.
*H01L 51/00*    (2006.01)

(52) U.S. Cl.
CPC .................................. *H01L 51/0098* (2013.01)
USPC ........... 257/40; 257/2; 257/3; 257/4; 365/151

(58) Field of Classification Search
CPC .............. B82Y 10/00; G11C 13/0014; G11C 13/0016; G11C 13/0009; H01L 27/28; H01L 51/0035; H01L 51/0036; H01L 51/0041; H01L 51/0078
USPC ........................................................ 257/2–4
See application file for complete search history.

(56) References Cited

U.S. PATENT DOCUMENTS

| | | | |
|---|---|---|---|
| 6,852,586 B1 | 2/2005 | Buynoski et al. | |
| 7,309,875 B2 * | 12/2007 | Ohlberg | 257/40 |
| 2003/0137869 A1 * | 7/2003 | Kozicki | 365/158 |
| 2004/0217347 A1 * | 11/2004 | Tripsas et al. | 257/40 |
| 2005/0116256 A1 * | 6/2005 | Bulovic et al. | 257/200 |
| 2005/0161715 A1 * | 7/2005 | Perner et al. | 257/295 |
| 2005/0227382 A1 * | 10/2005 | Hui | 438/14 |
| 2010/0015755 A1 * | 1/2010 | Matsui et al. | 438/95 |
| 2010/0090192 A1 | 4/2010 | Goux et al. | |
| 2011/0198554 A1 | 8/2011 | Iijima et al. | |
| 2012/0040181 A1 * | 2/2012 | Barattin et al. | 428/336 |
| 2012/0228576 A1 * | 9/2012 | Asakawa et al. | 257/4 |

FOREIGN PATENT DOCUMENTS

JP    2007-527620    9/2007
WO    2012/127542 A1    9/2012

* cited by examiner

*Primary Examiner* — David Vu
*Assistant Examiner* — Jonathan Han
(74) *Attorney, Agent, or Firm* — Patterson & Sheridan LLP

(57) ABSTRACT

A molecular memory device has an insulating film with a cavity, the cavity having an upper portion and a lower portion; a first conductive member with a portion exposed at the lower portion of the cavity; a second conductive member with a portion exposed at the upper portion of the cavity; and a resistance varying-type molecular chain disposed in the cavity and bonded with the first conductive member or the second conductive member. The cavity is wider than at least one of the first conductive member along a first direction and the second conductive member along a second direction.

18 Claims, 33 Drawing Sheets

MOLECULAR MEMORY

CROSS-REFERENCE TO RELATED APPLICATION

This application is based upon and claims the benefit of priority from Japanese Patent Application No. 2012-130060, filed Jun. 7, 2012, the entire contents of which are incorporated herein by reference.

FIELD

Embodiments described herein relate generally to molecular memory.

BACKGROUND

For NAND-type flash memory and other nonvolatile storage devices in the related art, miniaturization of memory cells can increase the storage density. However, the miniaturization of conventional memory cells is nearing its limit due to technological restrictions of lithographic patterning technology.

Research is being carried out on molecular memory using resistance varying-type molecular chains as the storage elements. The resistance varying-type molecular chains are molecules that have electrical resistance values which change when subjected to an input of an electric signal. As molecules are generally small in size, it is possible to significantly miniaturize the memory cells. However, as the memory cells are miniaturized, the leakage current of the memory cell portion relatively increases, which is undesirable.

DESCRIPTION OF THE DRAWINGS

FIG. 3A and FIG. 3B to FIG. 14A and FIG. 14B are cross-sectional views illustrating an example of a method of manufacturing a molecular memory according to a first embodiment.

FIG. 15A shows the molecular memory according to the first embodiment, and FIG. 15B shows the molecular memory according to a comparative example.

FIG. 17A and FIG. 17B to FIG. 31A and FIG. 31B are cross-sectional views illustrating an example of a method of manufacturing a molecular memory according to a second embodiment.

DETAILED DESCRIPTION

One purpose of the present disclosure is to solve the problems of the related art by providing a molecular memory with low leakage current in the memory cell portion.

In general, a molecular memory according to an embodiment of the present disclosure has an insulating film with a cavity; a first conductive member, which has a portion exposed on the lower portion of the cavity; a second conductive member which has a portion exposed on the upper portion of the cavity; and a resistance varying-type molecular chain disposed in the cavity. The cavity is wider than at least one of the first conductive member along a first direction and the second conductive member along a second direction.

Embodiments of the present disclosure will be explained with reference to figures.

Embodiment 1 will be explained first.

Figure 1A:
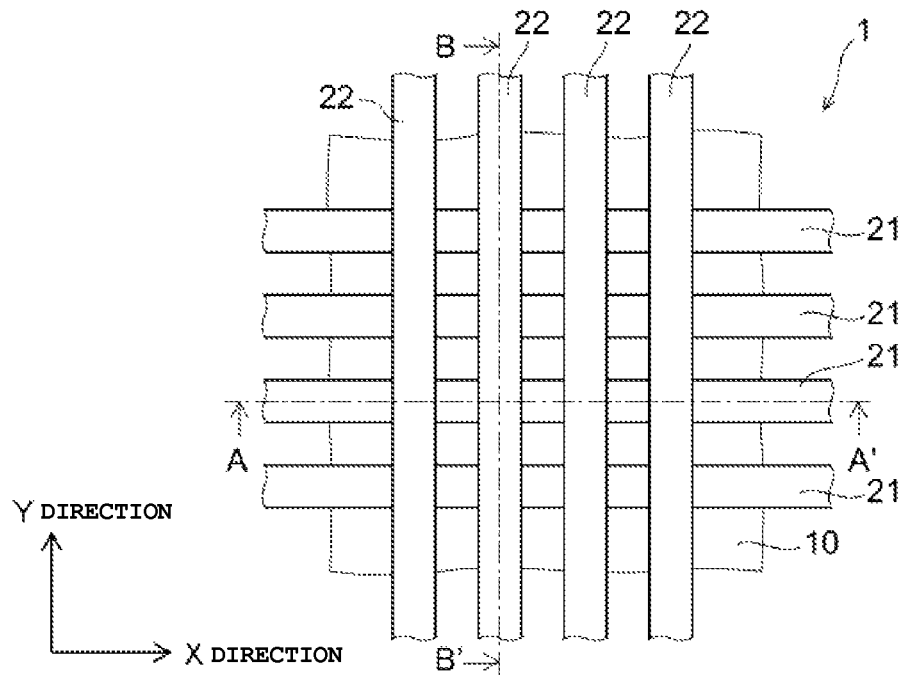
FIG. 1A is a plane view illustrating an example of a molecular memory according to a first embodiment.
Figure 1B:
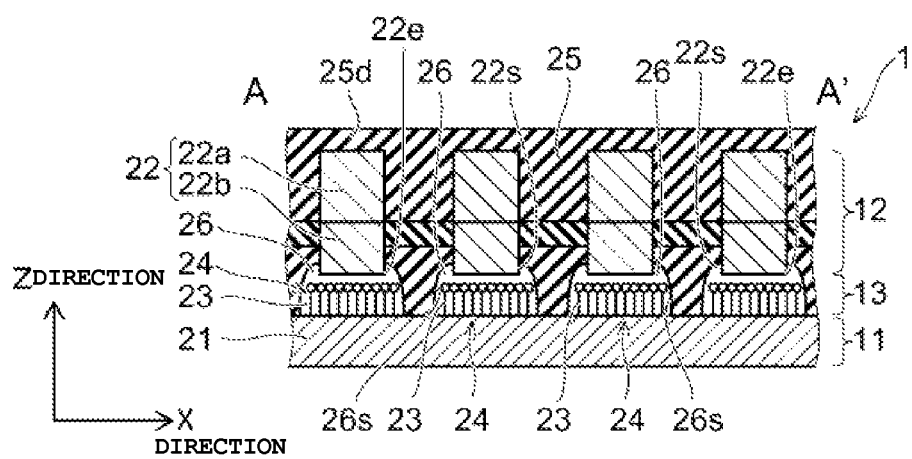
FIG. 1B is a cross-sectional view taken across A-A' in FIG. 1A.

FIG. 1A is a plane view illustrating the molecular memory according to this embodiment. FIG. 1B is a cross-sectional view taken across A-A' in FIG. 1A, and FIG. 1C is a cross-sectional view taken across B-B' in FIG. 1A.

Figure 2:
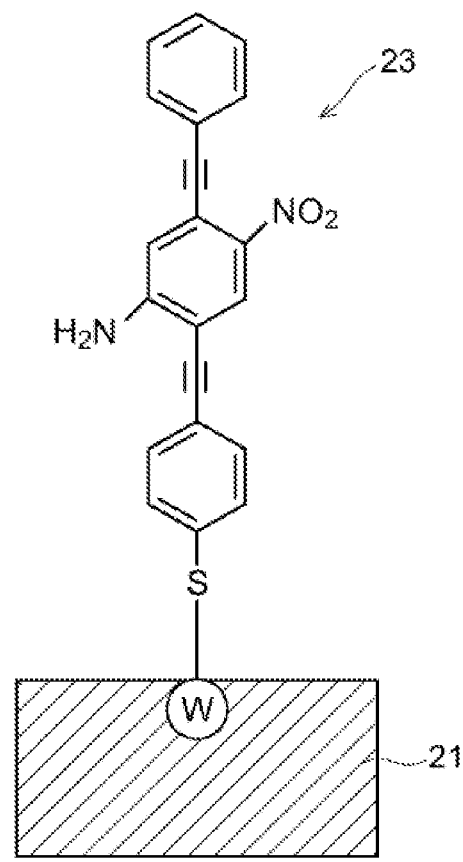
FIG. 2 is a diagram illustrating an example of a resistance varying-type molecular chain according to a first embodiment.

FIG. 2 is a diagram illustrating an example of the resistance varying-type molecular chain in this embodiment.

In order to facilitate viewing these figures, only the electroconductive portion is shown, while the insulating portion is not shown.

Figure 1C:
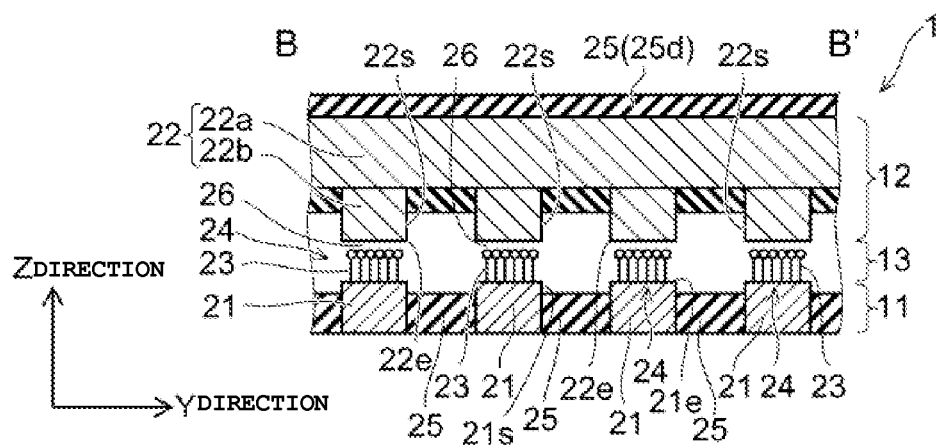
FIG. 1C is a cross-sectional view taken across B-B' in FIG. 1A.

As shown in FIG. 1A to FIG. 1C, in a molecular memory 1 according to this embodiment, an interlayer insulating film (not shown in the figure) is arranged on a silicon substrate 10. On this interlayer insulating film, a wiring layer 11, a storage layer 13 and a wiring layer 12 are laminated sequentially. In the following, this laminating direction will be referred to as "Z-direction". In the wiring layer 11, plural wires 21 extending in one direction (hereinafter referred to as "X-direction") are arranged periodically. In the wiring layer 12, plural wires 22 extending in a direction crossing, such as orthogonally crossing X-direction (hereinafter referred to as "Y-direction") are arranged periodically. The X-direction, Y-direction and Z-direction are orthogonal to each other. To facilitate the explanation of this specification, for the Z-direction, one side is referred to as "upper", and the other side is referred to as "lower"; yet, they are irrelevant to the gravity direction. For example, the direction away from the silicon substrate 10 is referred to as "upper", and the direction towards it is referred to as "lower".

The wires 21 and wires 22 are made of electroconductive materials different from each other, respectively. For example, the wires 21 may be made of tungsten (W), while the wires 22 may be made of molybdenum (Mo).

Each of the wires 22 includes a linear-shaped main body portion 22a extending in the Y-direction and a protrusion portion 22b extending downward in a region right above the wire 21, specifically in the direction towards the wire 21. The protrusion portion 22b has a pillar shape, and the wires 21 and wires 22 are arranged in a matrix configuration with the same period in the direction wherein the wires 21 extend (X-direction) and the direction where the wires 22 extend (Y-direction), respectively.

In the portion where each wire 21 and each wire 22 are nearest to each other, that is, in the region below the protrusion portion 22b, plural resistance varying type-molecular chains 23 are arranged. The resistance varying-type molecular chain 23 is a molecule that has an electrical resistance value which changes as an electric signal of voltage or current is applied. For example, the resistance varying-type molecular chain may be a straight, chain-shaped organic molecule. In each nearest portion, for example, about tens to hundreds of the resistance varying-type molecular chains 23 are assembled to form a storage molecular layer 24. The plural storage molecular layers 24 are arranged in a matrix configuration along the X-direction and the Y-direction to form the storage layer 13.

As shown in FIG. 2, the resistance varying-type molecular chain 23 may be 4-[2-amino-5-nitro-4-(phenylethynyl)phenylethynyl]benzenethiol, with the thiol group (R—SH) arranged on one end. The sulfur atom (S) of the thiol group can be easily bonded to tungsten atom (W). On the other hand, there is no group in the resistance varying-type molecular chain 23 which is easily bonded to the molybdenum atom (Mo). Consequently, the functional resistance varying-type molecular chain 23 can be bonded to tungsten in preference to the molybdenum surface. As a result, the resistance varying-type molecular chain 23 is bonded to the wire 21 made of tungsten, while it is not bonded with the wire 22 made of molybdenum. Consequently, each resistance varying-type molecular chain 23 has one end portion bonded with the wire 21, with this end portion being the start point, and it extends generally in the direction from the wire 21 towards the wire 22 (Z-direction). However, few of the resistance varying-type molecular chain 23 can be bonded to the molybdenum surface in some cases, although not shown in the figure. This does not matter because the electrical properties are not expected to change.

In the molecular memory 1, an interlayer insulating film 25 is arranged to embed the wires 21, the wires 22, and the storage molecular layer 24. The interlayer insulating film 25 is formed from an insulating material, such as silicon oxide ($SiO_2$). Within the interior of the interlayer insulating film 25, cavity 26 is formed. The cavity 26 is formed inside the interlayer insulating film 25, and the storage molecular layer 24 is arranged in the cavity 26. Consequently, the resistance varying type-molecular chain 23 is not in contact with the interlayer insulating film 25.

The cavity 26 is formed in the region right below the wire 22, and it extends in the Y-direction. Then, the upper portion of the side surface and the upper surface of the wire 21 are exposed on the lower surface of cavity 26. On the other hand, the region excluding the upper portion of the side surface and the lower surface of the wire 21 is coated by the interlayer insulating film 25. Also, the lower portion of the side surface and the lower surface of the protrusion portion 22b of the wire 22 is exposed on the upper surface of the cavity 26. The region excluding the lower portion of the side surface of the protrusion portion 22b and the entirety of the main body portion 22a are coated by the interlayer insulating film 25.

As a result, as shown in FIG. 1B, with respect to the X-direction, the side surface 26s of cavity 26 is arranged on the outer side of the side surface 22s of the protrusion portion 22b of the wire 22 and its extended surface. Also, as cavity 26 extends in the Y-direction, the side surface of cavity 26 on the Y-direction side is arranged on the outer side of the region shown in FIG. 1C. Consequently, with respect to the Y-direction, the side surface of cavity 26 is arranged on the outer side of the side surface 22s of the protrusion portion 22b of the cavity 26 and its extended surface. As a result, the ridge line 22e on the lower surface side of the protrusion portion 22b is not coated by the interlayer insulating film 25, and it is exposed to the interior of cavity 26. Additionally, as shown in FIG. 1C, with respect to the Y-direction, the side surface 26s of cavity 26 is arranged on the outer side of the side surface 21s of the wire 21 and its extended surface. As a result, the ridge line 21e of the upper surface side of the wire 21 is not coated by the interlayer insulating film 25, and it is exposed to the interior of cavity 26.

In the following, the manufacturing method of the molecular memory according to this embodiment will be explained.

FIG. 3A and FIG. 3B to FIG. 14A and FIG. 14B are cross-sectional views illustrating the example of method of the manufacturing the molecular memory according to this embodiment. The cross-sections shown in FIG. 3A to FIG. 14A correspond to the cross-section taken across A-A' in FIG. 1A, and the cross-sections shown in FIG. 3B to 14B correspond to the cross-section taken across B-B' in FIG. 1A.

Figure 3A:
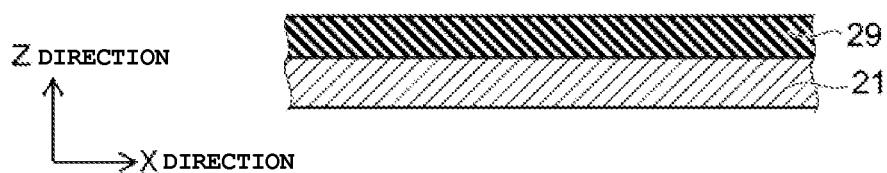
Figure 3B:
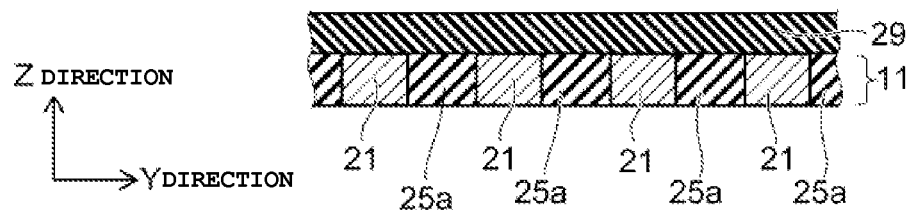

As shown in FIG. 3A and FIG. 3B, on the silicon substrate 10 (see FIG. 1A), an interlayer insulating film (not shown in the figure) is formed. On this interlayer insulating film, an electroconductive material, such as tungsten (W), is deposited to form an electroconductive film. Then, by performing lithography and etching, this electroconductive film is patterned to a line-and-space (L/S) configuration. As a result, plural wires 21 extending in the X-direction are formed from tungsten.

Next, an insulating material, such as silicon oxide ($SiO_2$), is deposited to form an insulating film 25a over the entire surface. Then, using the wires 21 as a stopper, CMP (chemical mechanical polishing) is carried out to remove the portions of insulating film 25a formed on the wires 21. As a result, the upper surface of the insulating film 25a is flattened to the same height as that of the upper surface of the wires 21. Consequently, plural wires 21 are arranged, with the insulating film 25a embedded in between the wires 21, forming the wiring layer 11. Next, an insulating material different from the material of the insulating film 25a, such as silicon nitride (SiN), is deposited, and a sacrificial film 29 is formed on the entire surface of the wiring layer 11.

Figure 4A:
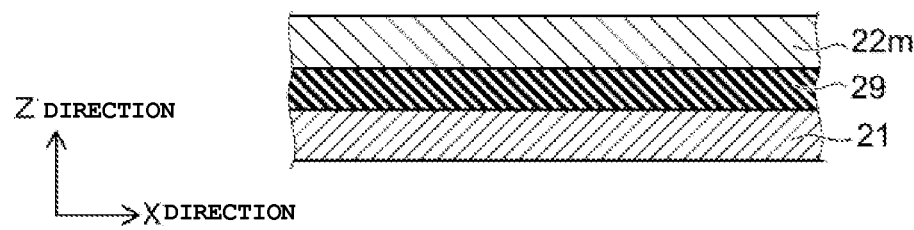
Figure 4B:
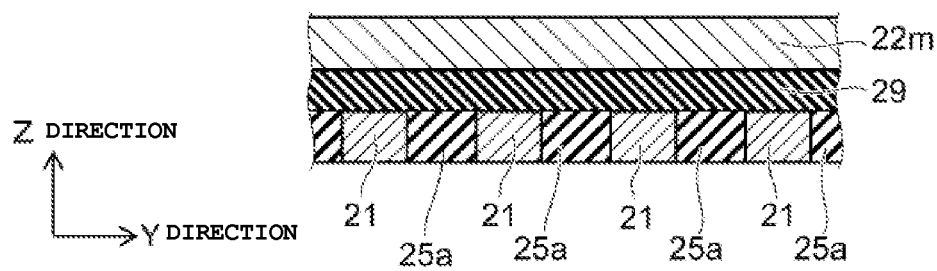

Then, as shown in FIG. 4A and FIG. 4B, an electroconductive material different from the material of the wires 21, such as molybdenum (Mo), is deposited, and an electroconductive film 22m made of molybdenum is formed on the entire surface of the sacrificial film 29.

Figure 5A:
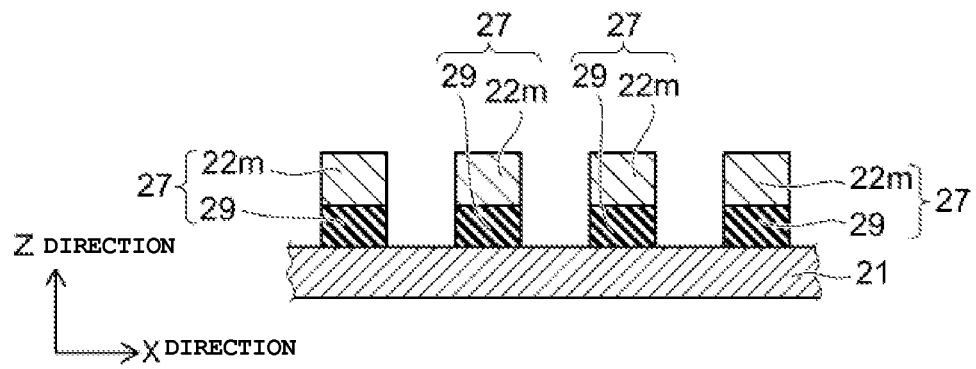
Figure 5B:
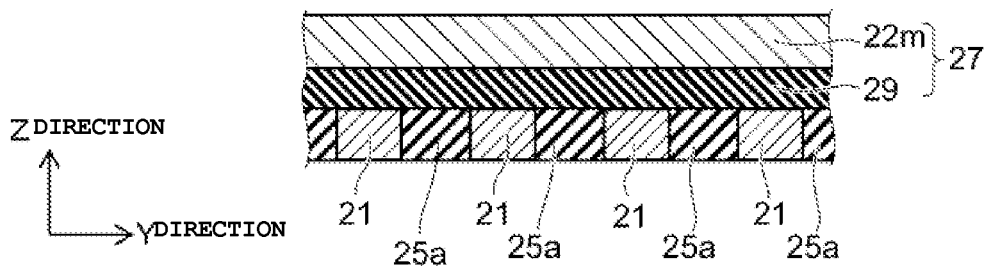

Next, as shown in FIG. 5A and FIG. 5B, lithography and etching are carried out to selectively remove the electroconductive film 22m and the sacrificial film 29 to form an L/S shaped pattern. As a result, a laminate 27 is formed as the sacrificial film 29, and the electroconductive film 22m is laminated.

Figure 6A:
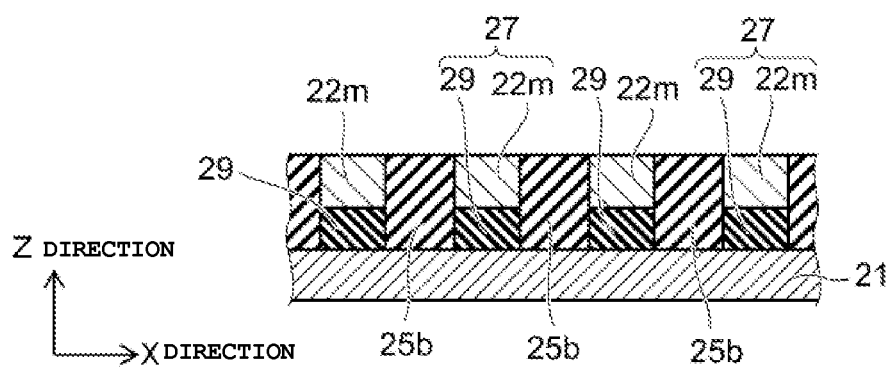
Figure 6B:
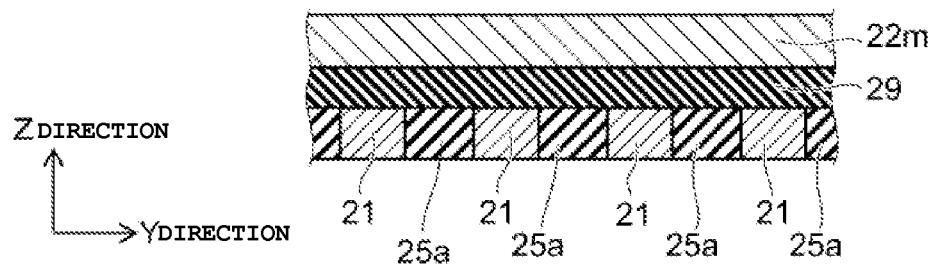

As shown in FIG. 6A and FIG. 6B, an insulating material different from the material of the sacrificial film 29, such as silicon oxide, is then deposited to form an insulating film 25b on the entire surface. Using the electroconductive film 22m as a stopper, CMP is carried out. As a result, the insulating film 25b is embedded between the portions of the laminate 27.

Figure 7A:
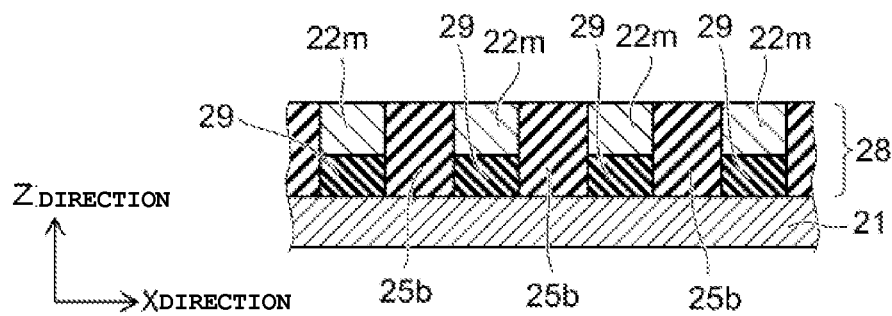
Figure 7B:
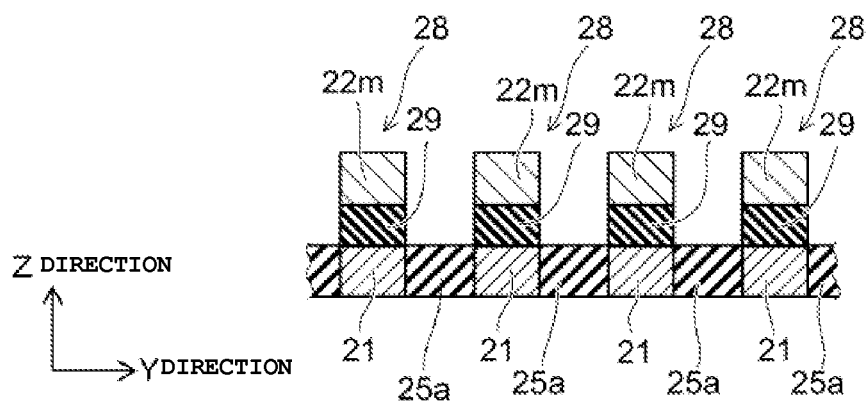

Next, as shown in FIG. 7A and FIG. 7B, lithography and etching are carried out to selectively remove the sacrificial film 29, the electroconductive film 22m and the insulating film 25b, while leaving them in the region right above the wires 21. As a result, the sacrificial film 29, the electroconductive film 22m and the insulating film 25b are patterned into an L/S shape, forming a laminate 28 extending in the X-direction. In the laminate 28, the laminate including the sacrificial film 29, electroconductive film 22m and the insulating film 25b are arranged alternately in the X-direction. In this case, the laminate including the sacrificial film 29, the electroconductive film 22m and the insulating film 25b are processed into a pillar shape extending in the Z-direction, while the wires 21 are kept in the shape of lines extending in the X-direction. Additionally, the electroconductive film 22m is cut into a matrix configuration along the X-direction and the Y-direction.

Figure 8A:
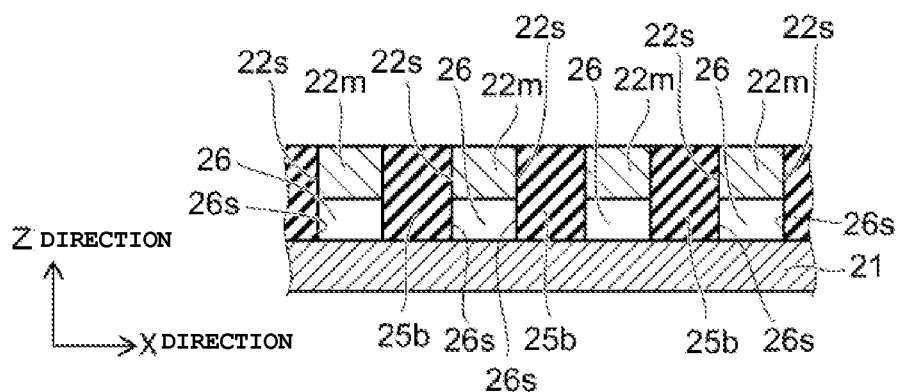
Figure 8B:
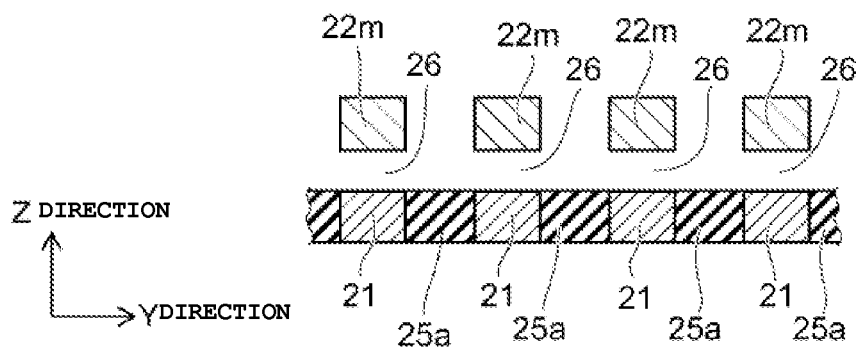

As shown in FIG. 8A and FIG. 8B, an etching liquid, such as hot phosphoric acid ($H_3PO_3$), is then adopted to perform wet etching, and the sacrificial film 29 is removed (see FIG. 7A and FIG. 7B). As a result, cavity 26 is formed in the space after removal of the sacrificial film 29 in the operation. In this step, the side surface 26s of cavity 26 facing the X-direction is positioned on the extended surface of the side surface 22s of the electroconductive film 22m facing the X-direction. On the two sides of cavity 26 in the X-direction, the insulating film 25b is arranged, and the wire 21 is arranged on the lower side, while the electroconductive film 22m is arranged on the upper side. In addition, the plural spaces where the sacrificial film 29 was arranged are connected to each other and run through cavity 26 in the Y-direction. As a result, cavity 26 is connected to the outer side via the cavity between the adjacent electroconductive films 22m in the Y-direction.

Figure 9A:
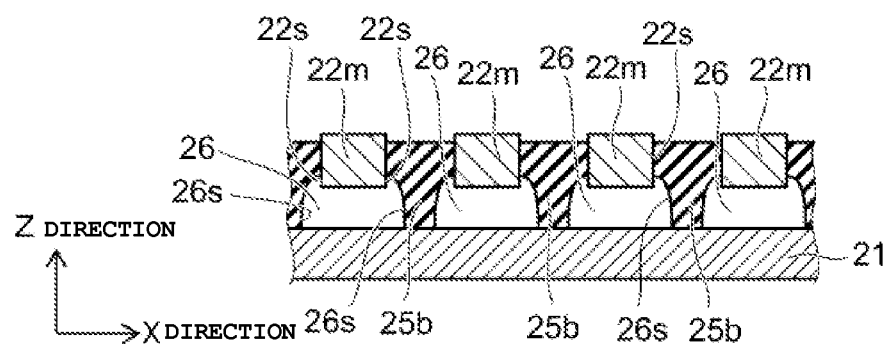
Figure 9B:
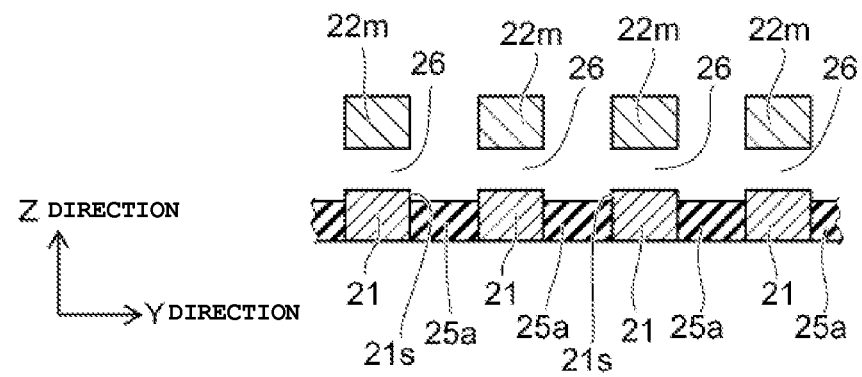

Then, as shown in FIG. 9A and FIG. 9B, isotropic etching is carried out for the silicon oxide. As a result, side etching is carried out for the insulating film 25b from the inner side of cavity 26 so that cavity 26 expands to the two sides in the X-direction. As a result, in the X-direction, the side surface 26s of cavity 26 recesses to the outer side from the extended surface of the side surface 22s of the electroconductive film 22m. Also, in this case, the portion arranged between the electroconductive films 22m in the insulating film 25b is etched with the interface with the electroconductive film 22m as the start point, and cavity 26 also expands upward on the two sides of the electroconductive film 22m in the X-direction. As a result, the upper surface of cavity 26 recesses, and the lower portion of the side surface 22s of electroconductive film 22m is exposed to the interior of cavity 26. In addition, the portion arranged between the wires 21 in the insulating film 25a is also etched, and cavity 26 expands downward between the wires 21. Consequently, the lower surface of cavity 26 recesses and the upper portion on the side surface 21s of the wire 21 is exposed to the interior of cavity 26.

Figure 10A:
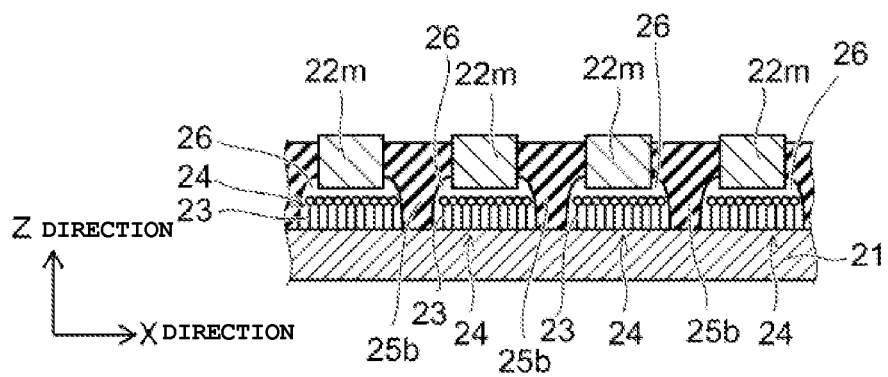
Figure 10B:
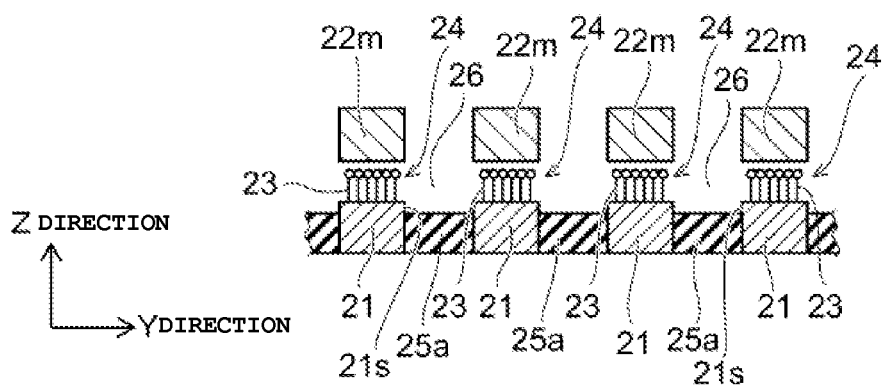

As shown in FIG. 10A and FIG. 10B, a chemical solution containing the resistance varying-type molecular chains 23 is then introduced to cavity 26, after which it is allowed to dry. As a result, one end portion of the resistance varying-type molecular chain 23 is bonded with the wire 21 made of tungsten, and the resistance varying-type molecular chains 23 are disposed in cavity 26. In each region right below the electroconductive film 22m, the storage molecular layer 24 is formed. In this case, the region of the upper portion of the side surface 21s of the wire 21 is not coated by the insulating film 25a; instead, it is exposed to the interior of cavity 26. Consequently, in this region, too, the resistance varying-type molecular chains 23 are also bonded. On the other hand, the resistance varying-type molecular chain 23 is not bonded to the electroconductive film 22m made of molybdenum. In addition, the resistance varying-type molecular chain 23 is not bonded to the insulating films 25a and 25b.

Figure 11A:
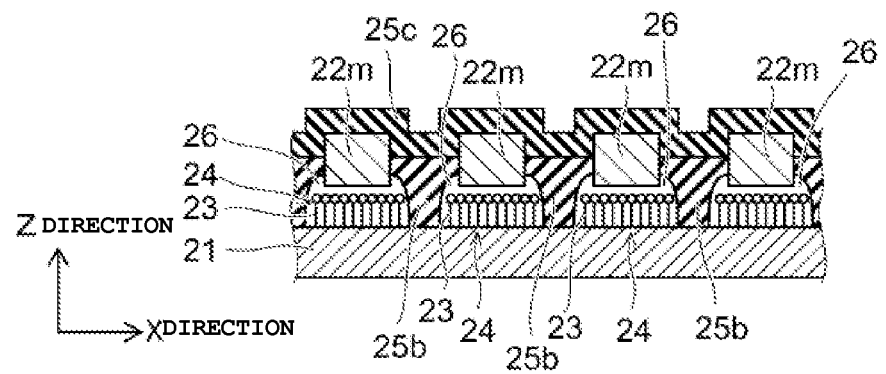
Figure 11B:
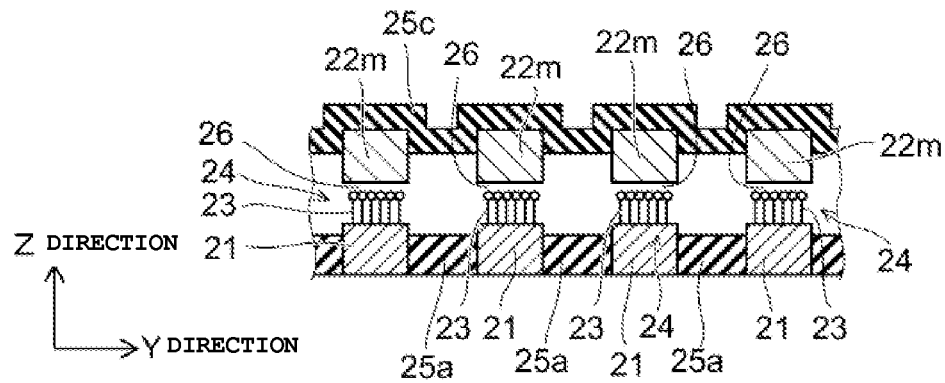

Then, as shown in FIG. 11A and FIG. 11B, the silicon oxide ($SiO_2$) or another insulating material is deposited by, for example, the CVD (chemical vapor deposition) method under a condition of poor embedding (gap-filling) property. As a result, the insulating film 25c is formed between electroconductive films 22m. In this case, cavity 26 is not embedded by the insulating film 25c, and the upper portion of cavity 26 is sealed off by the insulating film 25c.

Figure 12A:
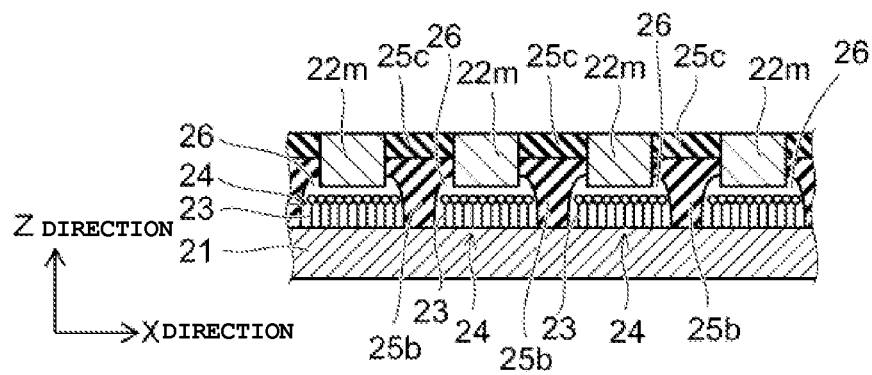
Figure 12B:
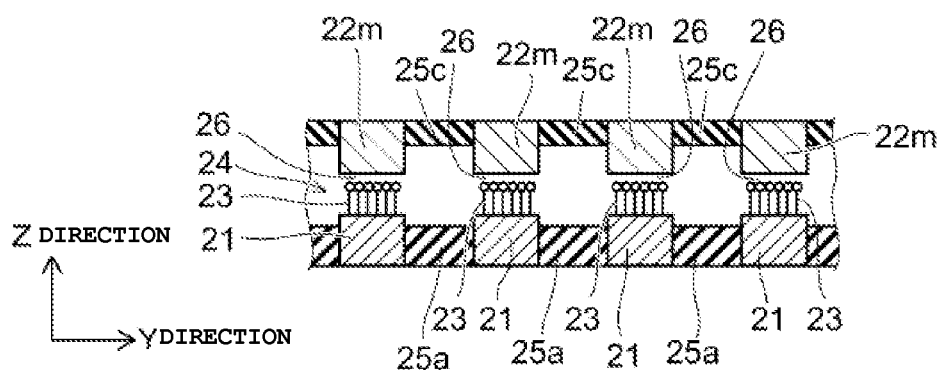

Next, as shown in FIG. 12A and FIG. 12B, flattening treatment of CMP or the like is carried out with the electroconductive film 22m used as a stopper, and the portions of the insulating film 25c arranged over the electroconductive film 22m are removed.

Figure 13A:
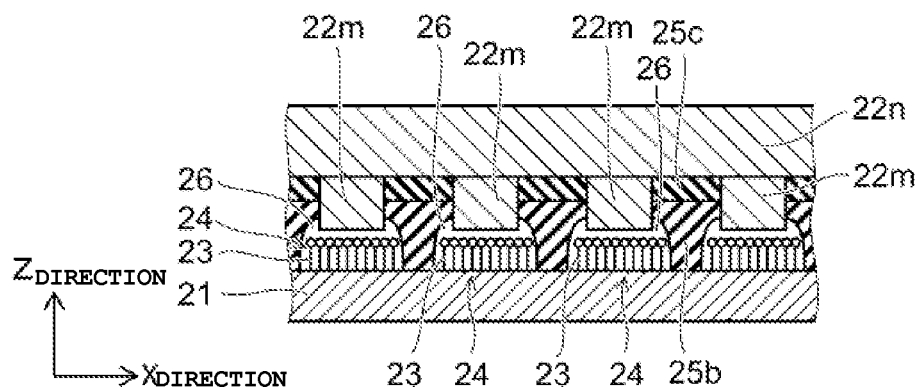
Figure 13B:
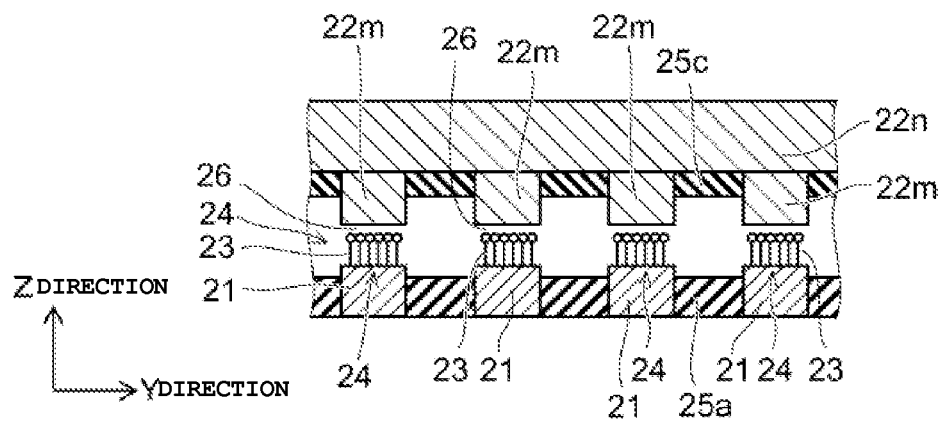

As shown in FIG. 13A and FIG. 13B, molybdenum is then deposited, and an electroconductive film 22n is formed on the entire surface. The electroconductive film 22n is in contact with the electroconductive film 22m.

Figure 14A:
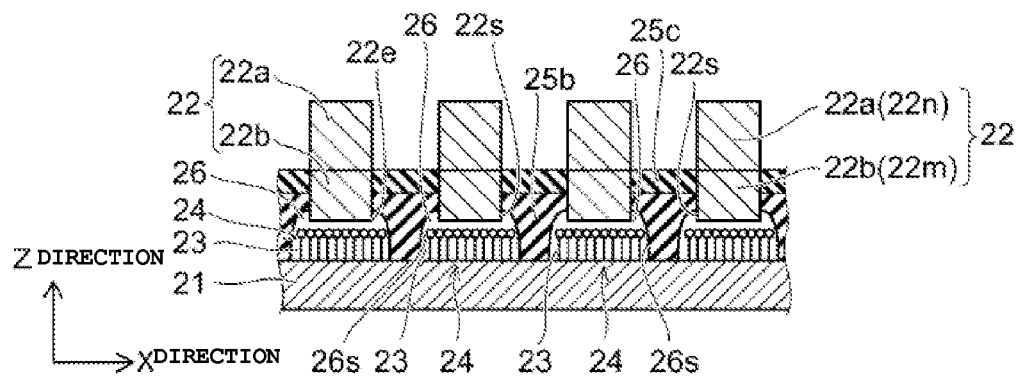
Figure 14B:
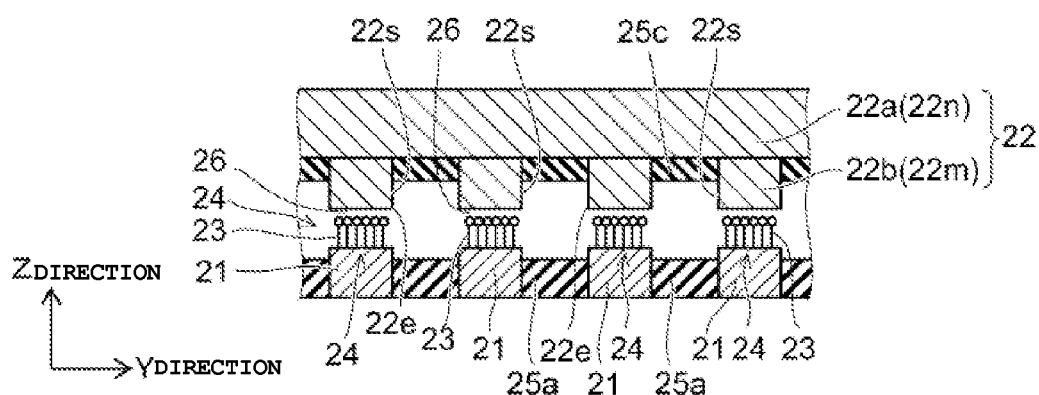

As shown in FIG. 14A and FIG. 14B, lithography and etching are carried out next to selectively remove the electroconductive film 22n, so that it is patterned to the L/S shape extending in the Y-direction. In this case, the various portions of the divided electroconductive film 22n are left so that the regions right above the plural electroconductive films 22m are arranged in matrix configuration along the X-direction and the Y-direction, passing along Y-direction. As a result, the various portions of the electroconductive film 22n are commonly connected to the plural electroconductive films 22m arranged in a row in the Y-direction to form wires 22. In this case, the electroconductive film 22n becomes the main body portion 22a of the wire 22, and the electroconductive film 22m becomes the protrusion portion 22b of the wire 22.

Then, as shown in FIG. 1A to FIG. 1C, an insulating material, such as silicon oxide, is deposited to form a passivation film 25d to cover the wires 22. Subsequently, portions of the passivation film 25d are removed to expose the pads (not shown in the figure) for leading out the wires 21 and 22. As a result, the molecular memory 1 of this embodiment is manufactured.

In the molecular memory 1, insulating films 25a, 25b, 25c and passivation film 25d become a portion of the interlayer insulating film 25. In addition, in the Z-direction, the area wherein the wires 21 are arranged becomes the wiring layer 11, the area where the wires 22 are arranged becomes the wiring layer 12. The area between the wiring layer 11 and the wiring layer 12 becomes storage layer 13.

Then, in each of the nearest portions between the wire 21 and wire 22, a memory cell containing one storage molecular layer 24 is formed. As a result, the memory cells are arranged in a matrix configuration in the X-direction and the Y-direction, and a cross point type cell array is formed. Next, as a prescribed voltage is applied between one wire 21 and one wire 22, the electronic state of the resistance varying-type molecular chain 23 contained in the storage molecular layer 24 is changed, so that the electrical resistance value changes. For example, by applying a prescribed positive voltage between the wires, the resistance varying-type molecular chain 23 transitions from the high-resistance state to the low-resistance state. This operation is called "set". Additionally, when a prescribed negative voltage is applied between the wires, the resistance varying-type molecular chain transitions from the low-resistance state to the high-resistance state. This operation is called "reset". In this way, the resistance state of the resistance varying-type molecular chain 23 can be switched at will, and the information can be written in each memory cell. By detecting the electrical resistance value between the wire 21 and the wire 22, it is then possible to read the information written in it. On the other hand, by combining the materials of the resistance varying-type molecular chain 23, the wire 21 and the wire 22, it is possible to create a rectifying property. As a result, in the set mode, even when a reverse bias is applied on the non-selected cell, flow of a reverse current in the non-selected cell can be suppressed.

In the following, the operation and effects of this embodiment will be explained.

Figure 15A:
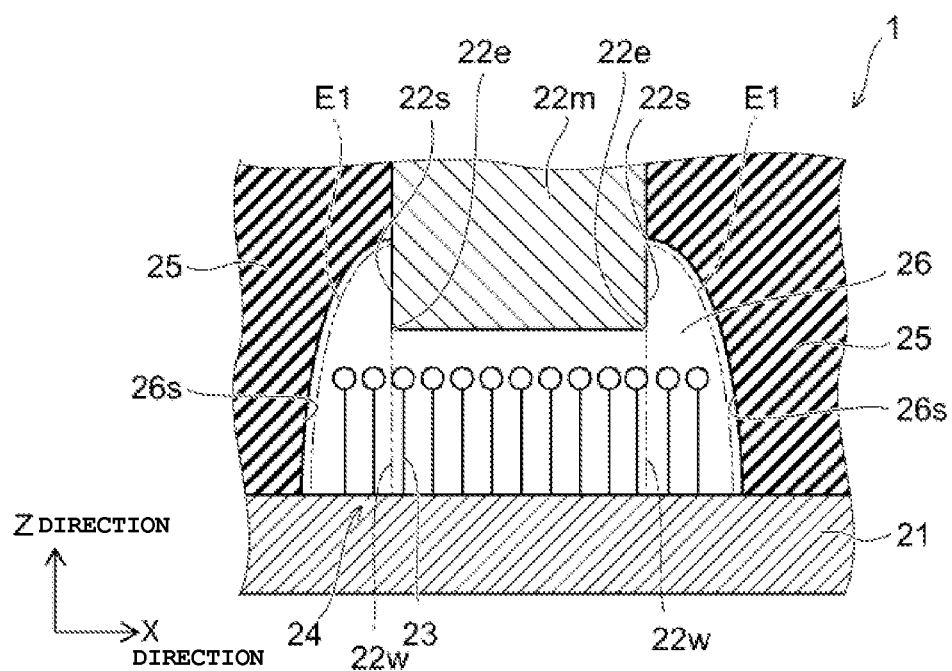
FIG. 15A and FIG. 15B are diagrams illustrating the operation and effects of molecular memory.
Figure 15B:
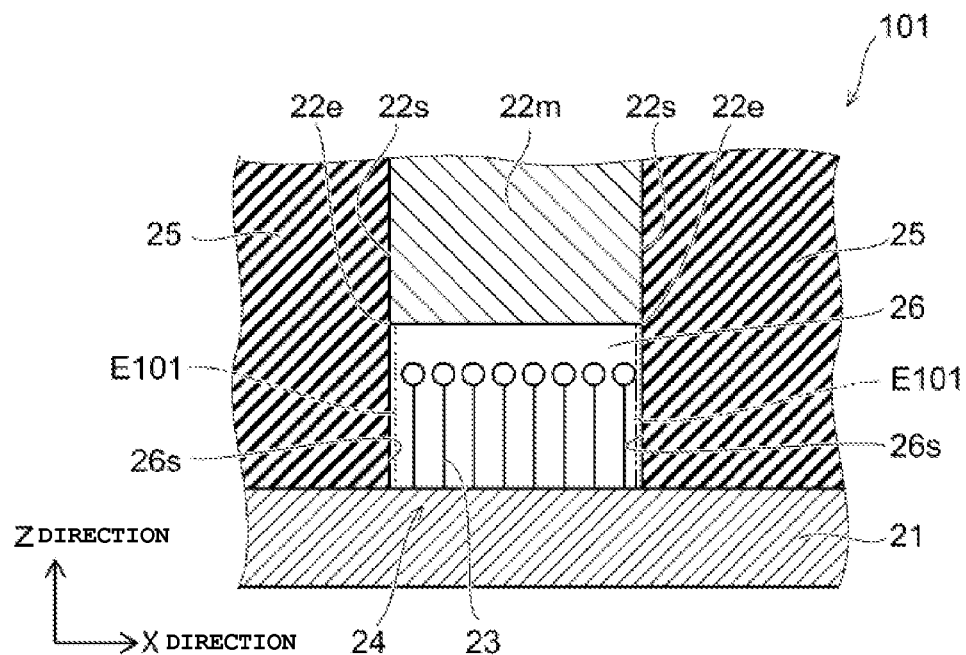

FIG. 15A and FIG. 15B are diagrams illustrating the operation and effect of the first embodiment. FIG. 15A shows the molecular memory according to the first embodiment, and FIG. 15B shows the molecular memory according to a comparative example.

As shown in FIG. 15A, for the molecular memory 1 according to the first embodiment, in the interlayer insulating film 25, cavity 26 is formed in the region right below the protrusion portion 22b of the wire 22, and the side surface 26a of cavity 26 is arranged on the outer side of the side surface 22s of the protrusion portion 22b of the wire 22 and its extended surface 22w. Also, the ridge line 22e of the lower surface side of the protrusion portion 22b is not coated by the interlayer insulating film 25; instead, it is exposed to the interior of cavity 26. As a result, a current path E1 along the surface of the interlayer insulating film 25 that connects the wire 22 and the wire 21 is longer than the path along the extended surface 22w of the side surface 22s. As a result, in the molecular memory 1, the leakage current between the wire 22 and the wire 21 is low.

Similarly, as shown in FIG. 1C, cavity 26 runs along the wire 22, and at the crossing portion between the wire 21 and the wire 22, there is no end surface parallel with the side surface of the wire 21. As a result, the leakage current is low.

On the other hand, as shown in FIG. 15B, in the molecular memory 101 according to an comparative example, the side surface 26s of cavity 26 is positioned on the extended surface of the side surface 22s of the protrusion portion 22b. As a result, a current path E101 is formed along the surface of the interlayer insulating film 25 downward from the side surface 22s of the protrusion portion 22b. This current path E101 is shorter than the current path E1 shown in FIG. 15A. Consequently, in the molecular memory 101, the leakage current between the wire 22 and the wire 21 is higher than that of molecular memory 1, which increases the power consumption and, at the same time, makes the operation of the memory cell difficult. For example, a high leakage current (off leakage) when the storage molecular layer 24 is in the high-resistance state makes it difficult to set the resistance varying-type molecular chain 23.

Also, for the molecular memory 1, when compared with the molecular memory 101, the proportion of cavity 26 in the space between the wire 21 and the wire 21 is larger, and the proportion of the interlayer insulating film 25 is smaller. Because the dielectric constant of cavity 26 is smaller than that of the interlayer insulating film 25, the molecular memory 1 has the parasitic capacitance between the adjacent wires 21 lower than that of the molecular memory 101. Consequently, for the molecular memory 1, the interference between the memory cells is smaller, and a higher speed of operation can be realized easily.

In the step of operation shown in FIG. 10A and FIG. 10B, when the resistance varying-type molecular chain 23 is bonded with the wire 21, the resistance varying-type molecular chain 23 is also bonded to the upper region of the side surface 21s of the wire 21. As a result, there may be the following problem: in the area between the adjacent wires 21, the resistance varying-type molecular chains 23 bonded to the upper portion of the side surface 21s are in contact with each other, and a leakage current flows between the wires 21 via the resistance varying-type molecular chains 23.

Consequently, as the resistance varying-type molecular chains 23 bonded to the side surfaces 21s of the adjacent wires 21 are opposite to each other, these resistance varying-type molecular chains 23 are not actively bonded to each other. In addition, as previously explained, when the memory cell is in the bipolar operation (that is, when operation is carried out as the voltages in opposite polarities are applied in the "set" mode and the "reset" mode), one of the pair of the resistance varying-type molecular chains 23 bonded to the adjacent wires 21 has to be in the high-resistance state. As a result, even when this pair of resistance varying-type molecular chains 23 is electrically connected, short circuit still does not take place between the adjacent wires 21. In addition, when the resistance varying-type molecular chains 23 have a rectifying property, the leakage current can hardly flow because the reverse bias is kept from being applied on one of the resistance varying-type molecular chains 23. Furthermore, because the upper region of the side surface of the wire 21 has a small area, the number of the resistance varying-type molecular chains 23 bonded in this region is small. This means that the leakage current flowing through the resistance varying-type molecular chains 23 bonded on the side surface of the wire 21 has no problem in the practical application.

In the following, Embodiment 2 will be explained.

Figure 16A:
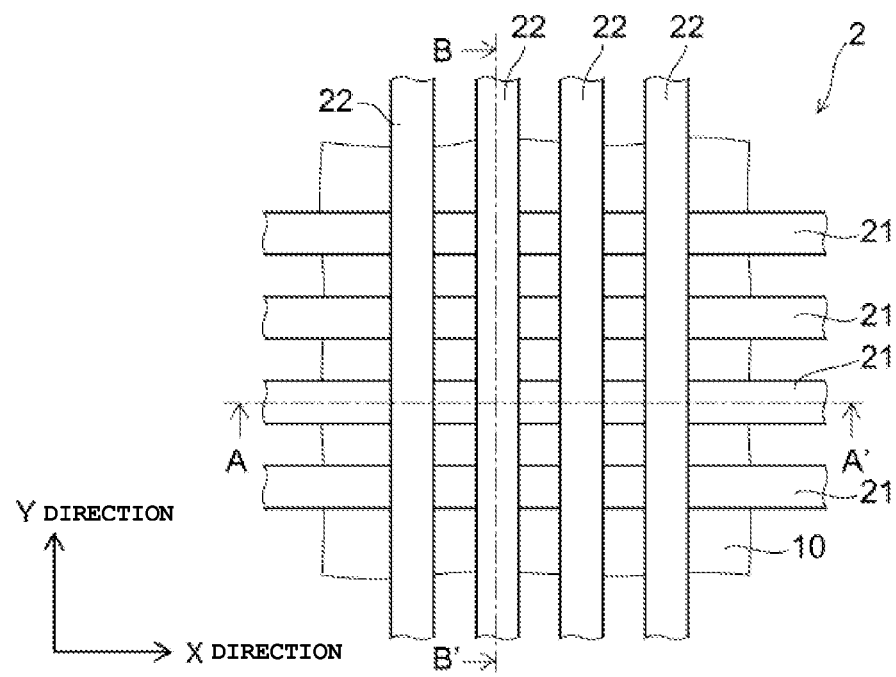
FIG. 16A is a plane view illustrating the molecular memory according to a second embodiment.
Figure 16B:
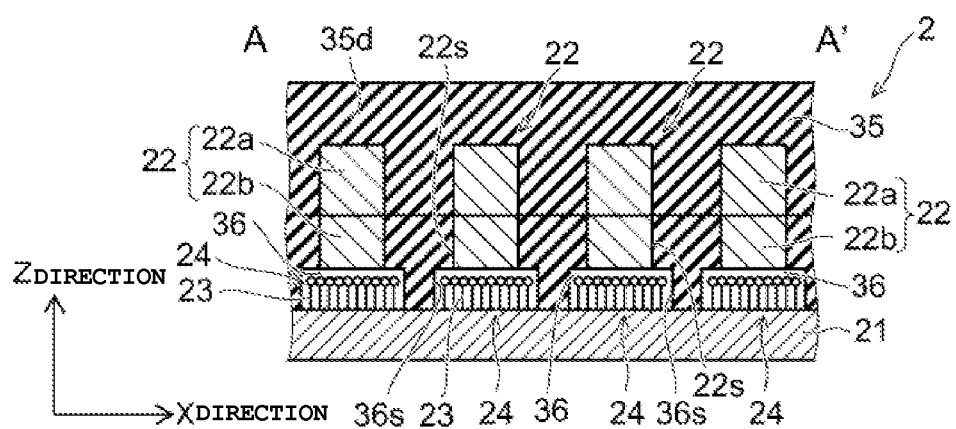
FIG. 16B is a cross-sectional view taken across A-A' in FIG. 16A.
Figure 16C:
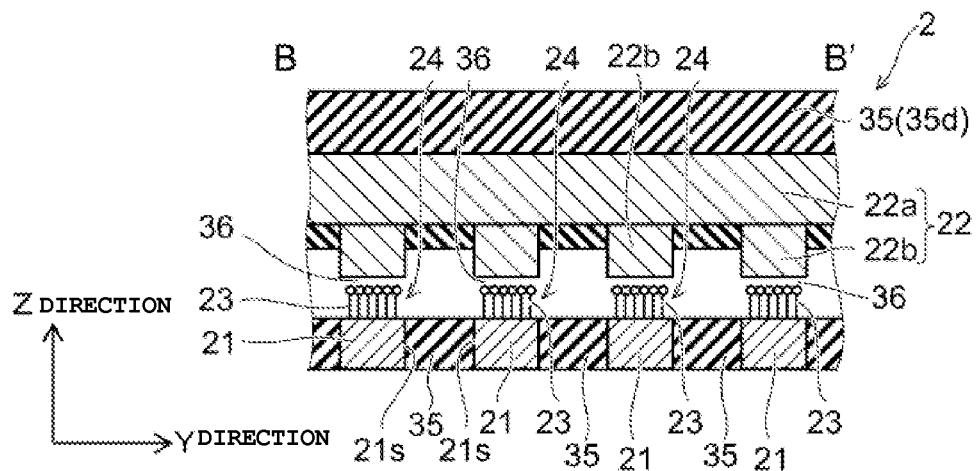
FIG. 16C is a cross-sectional view taken across B-B' in FIG. 16A.

FIG. 16A is a plane view illustrating an example of the molecular memory according to this second embodiment. FIG. 16B is a cross-sectional view taken across A-A' of FIG. 16A. FIG. 16C is a cross-sectional view taken across B-B' of FIG. 16A.

In order to facilitate viewing the figure, FIG. 16A shows only the electroconductive portion, while omitting the insulating portion.

As shown in FIG. 16A to FIG. 16C, for a molecular memory 2 according to this second embodiment, the material of an interlayer insulating film 35 and the shape of cavity 36 are different from those of the molecular memory 1 according to Embodiment 1. That is, for the molecular memory 2, an interlayer insulating film 35 is made of silicon oxide and organic SOG (spin-on-glass) material. Also, on the two sides of the protrusion portion 22b of the wire 22 in the X-direction, cavity 36 does not expand upward from the lower surface of the protrusion portion 22b and the cavity 36 does not expand downward from the upper surface of the wire 21. Consequently, the side surfaces of the wire 21 and wire 22 are entirely coated by the interlayer insulating film 35.

The features of the constitution of Embodiment 2 other than this feature are the same as those in described in Embodiment 1. Specifically, cavity 36 is formed in the region right below the wire 22, and it extends in the Y-direction. Additionally, cavity 36 also extends to the two sides in the X-direction as viewed from the region right below the main body portion 22a of the wire 22. Consequently, the side surface 36s of cavity 36 is arranged on the outer side of the side surface 22s of the protrusion portion 22b of the wire 22 and its extended surface. Also, the cavity 36 runs along the wire 22.

In the following, the manufacturing method of the molecular memory according to the second embodiment will be explained.

FIG. 17A and FIG. 17B to FIG. 31A and FIG. 31B are cross-sectional views illustrating an example of the steps of the manufacturing method of the molecular memory according to the second embodiment. The cross-sectional views shown in FIG. 17A to FIG. 31A correspond to the cross-sectional views taken across A-A' in FIG. 16A. The cross-sectional views shown in FIG. 17B to FIG. 31B correspond to the cross-sectional views taken across B-B' in FIG. 16A.

Figure 17A:
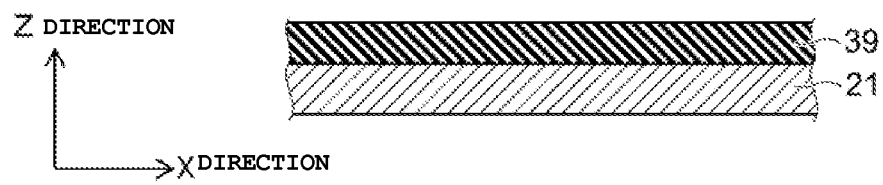
Figure 17B:
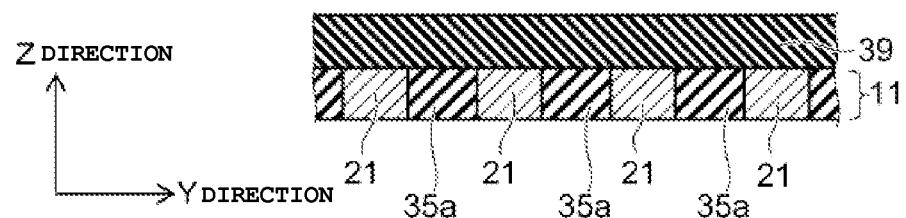

As shown in FIG. 17A and FIG. 17B, an interlayer insulating film (not shown in the figure) is formed on the silicon substrate 10 (see FIG. 16A). On this interlayer insulating film, an electroconductive material, such as tungsten (W), is deposited to form an electroconductive film. Then, lithography and etching are carried out to selectively remove the electroconductive film to form an L/S shaped pattern. As a result, plural wires 21 extending in the X-direction are formed.

Next, an insulating film 35a is formed on the entire surface. The insulating film 35a is an insulating film with a low etching rate by hydrogen fluoride (HF), and it can be used as an organic SOG film, for example. CMP is then carried out with the wires 21 used as a stopper to remove the portions of the insulating film 35a formed on the wires 21. As a result, the insulating film 35a is embedded between the wires 21, and plural wires 21 extending in the X-direction are arranged, with the insulating film 35a embedded in between the wires 21, forming the wiring layer 11. Then, an insulating material with a high etching rate by hydrogen fluoride (HF), such as silicon oxide (SiO2), is deposited, and a sacrificial film 39 is formed on the entire surface of the wiring layer 11.

Figure 18A:
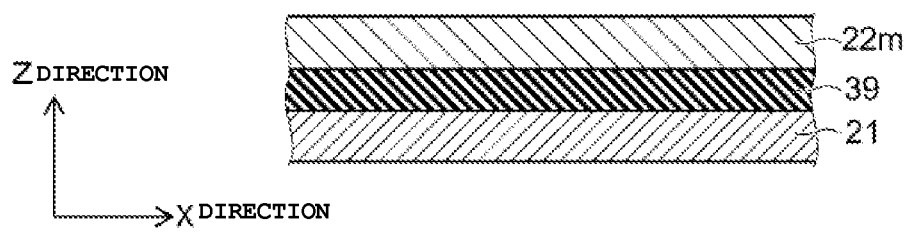
Figure 18B:
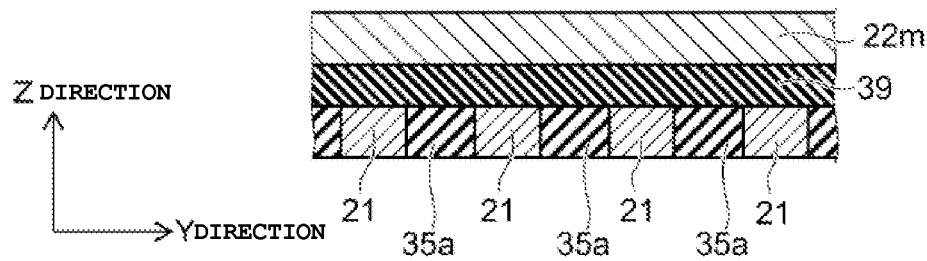

Next, as shown in FIG. 18A and FIG. 18B, an electroconductive material different from the material of the wires 21, such as molybdenum (Mo), is deposited, and an electroconductive film 22m is formed on the entire surface of the sacrificial film 39.

Figure 19A:
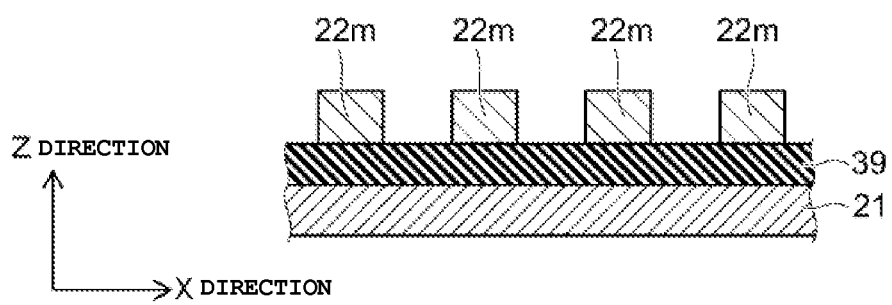
Figure 19B:
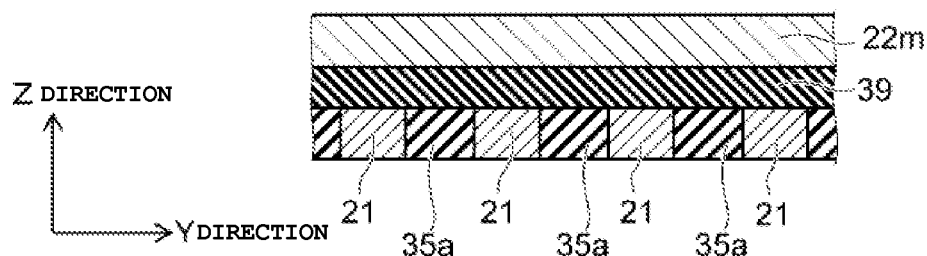

As shown in FIG. 19A and FIG. 19B, lithography and etching are then carried out to selectively remove the electroconductive film 22m to form an L/S shaped pattern extending in the Y direction. In Embodiment 1, in the step of the operation shown in FIG. 5A, in which a pattern is created on the electroconductive film 22m is patterned, the sacrificial film 29 also has a pattern created on it at the same time. However, in the present step of the operation, a pattern is not created on the sacrificial film 39.

Figure 20A:
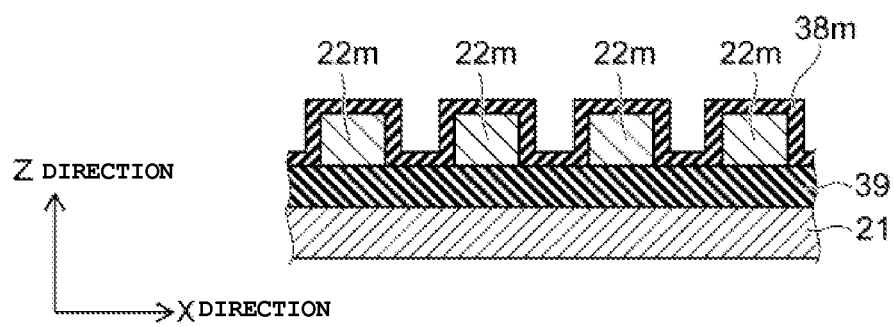
Figure 20B:
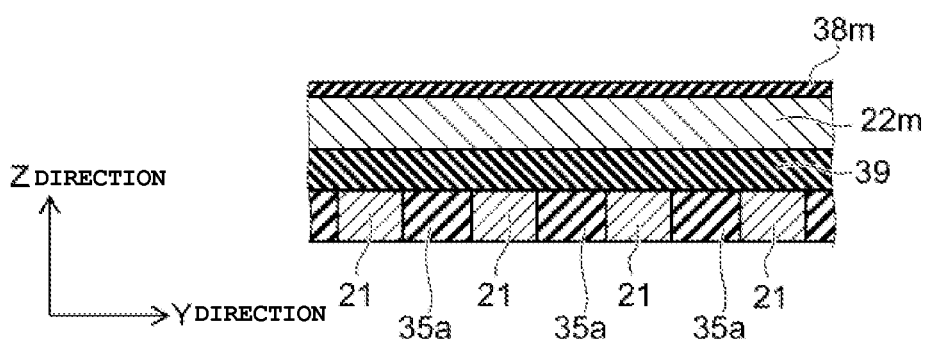

Then, as shown in FIG. 20A and FIG. 20B, an insulating material different from the material of the sacrificial film 39, such as silicon nitride (SiN), is deposited to form an insulating film 38m on the entire surface. Here, the insulating film 38m is thinner than the electroconductive film 22m, and it is formed to coat the electroconductive film 22m.

Figure 21A:
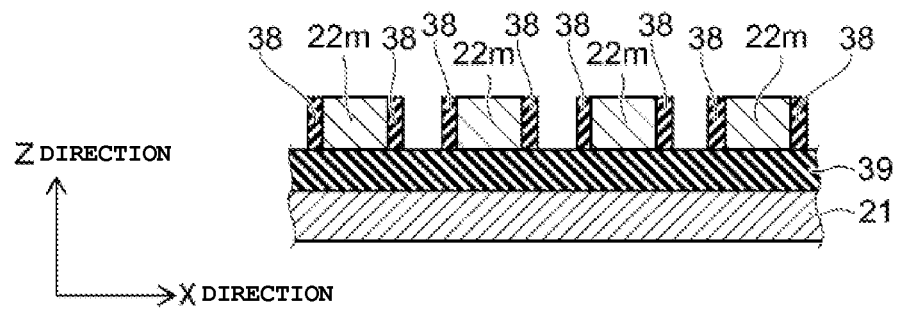
Figure 21B:
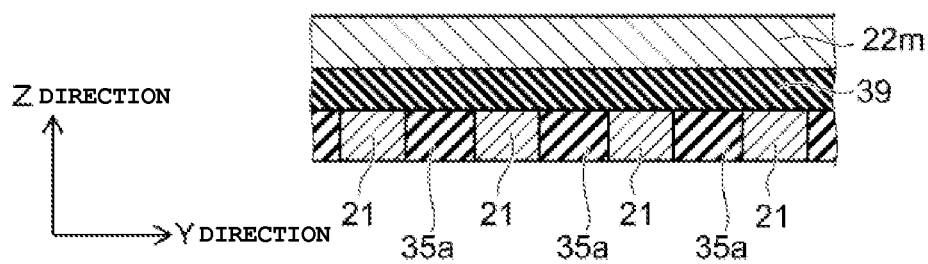

Next, as shown in FIG. 21A and FIG. 21B, anisotropic etching is carried out to remove the portions of the insulating film 38m formed on the upper surface of the sacrificial film and the portion formed on the upper surface of the electroconductive film 22m. As a result, the insulating film 38m is left only on the side surface of the electroconductive film 22m to become a side wall 38.

Figure 22A:
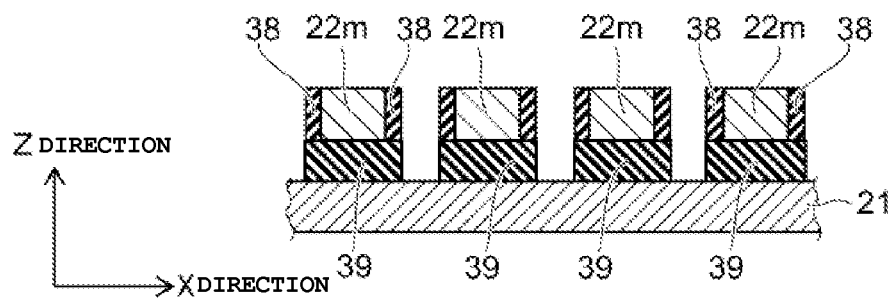
Figure 22B:
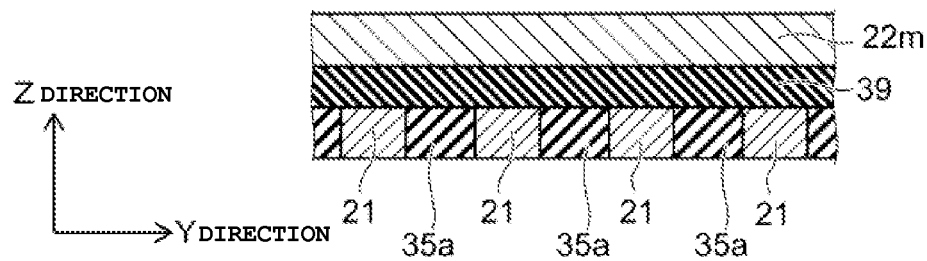

As shown in FIG. 22A and FIG. 22B, with the electroconductive film 22m and side wall 38 used as a mask, anisotropic etching is then carried out for the sacrificial film 39. As a result, the portions of the sacrificial film 39 right below the electroconductive film 22m and the side wall 38 are left, and an L/S shape extending in the Y-direction is obtained in the processing. In this case, the width of the sacrificial film 39 on which a pattern has been formed is greater than the width of the electroconductive film 22m by the thickness of the side walls 38 formed on the two side surfaces of the electroconductive film 22m.

Figure 23A:
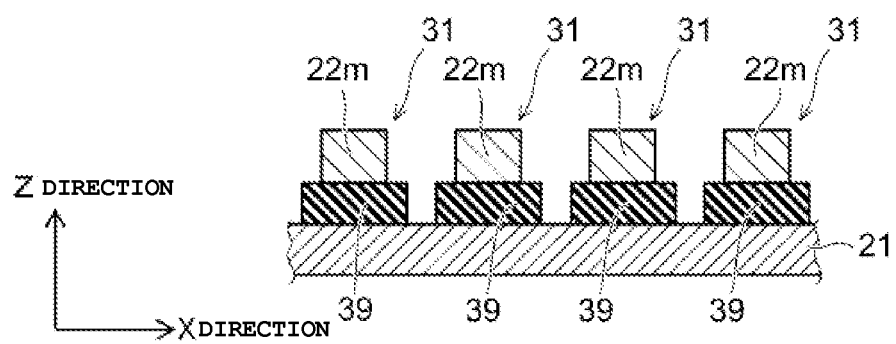
Figure 23B:
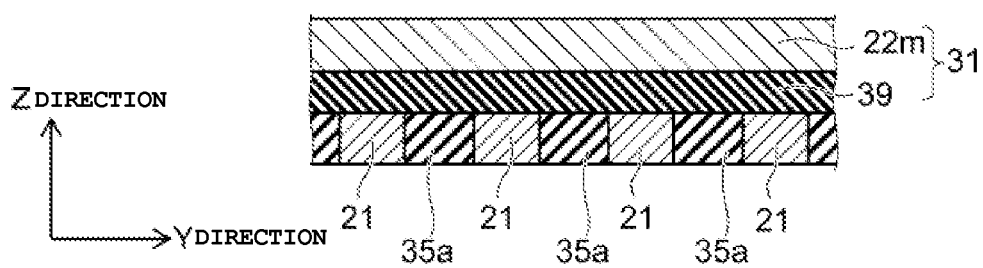

Then, as shown in FIG. 23A and FIG. 23B, an etching solution, such as a hot phosphoric acid (H3PO4) is adopted for wet etching to remove the side wall 38 (see FIG. 22A). As a result, a laminate 31 is formed as the sacrificial film 39 and the electroconductive film 22m are laminated.

Figure 24A:
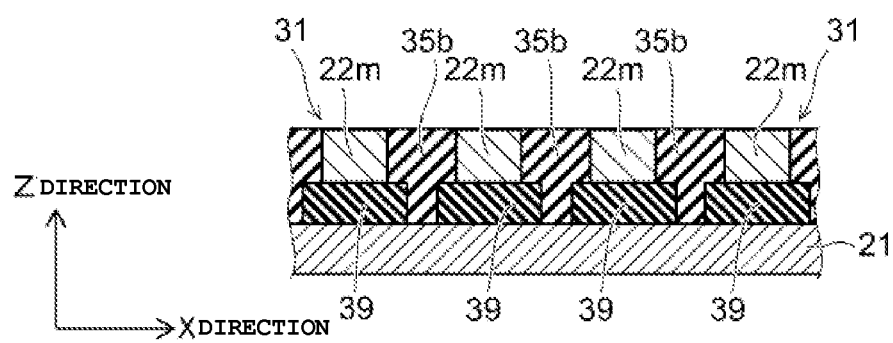
Figure 24B:
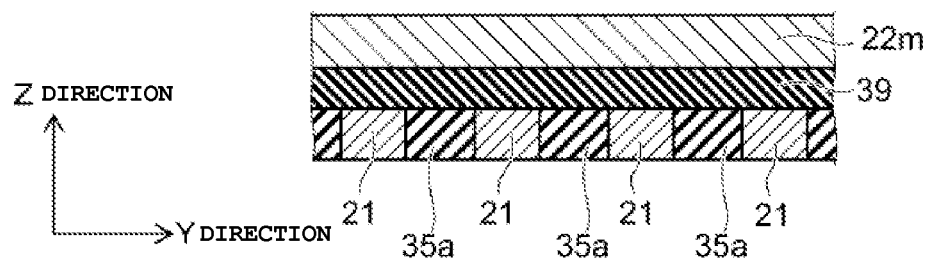

Next, as shown in FIG. 24A and FIG. 22B, an insulating film with a low etching rate in hydrogen fluoride (HF), such as an organic SOG film, is formed, and CMP is carried out. As a result, the insulating film 35b is embedded between the laminates 31.

Figure 25A:
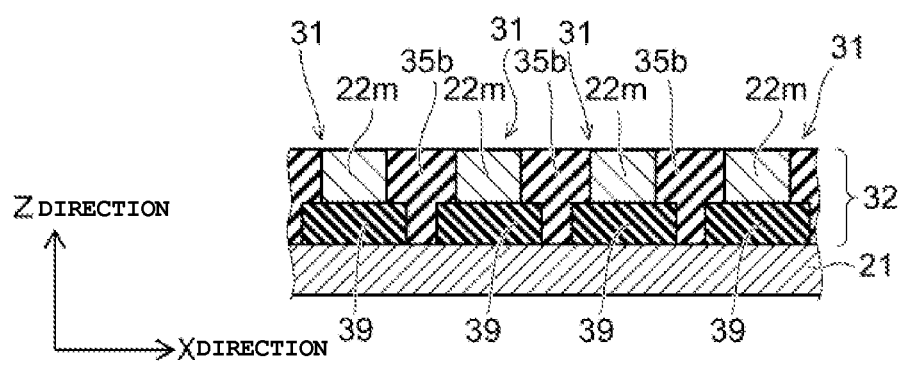
Figure 25B:
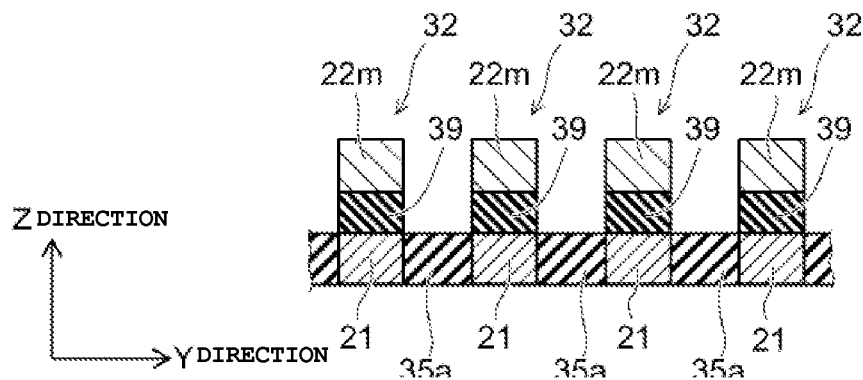

As shown in FIG. 25A and FIG. 25B, lithography and etching are then carried out to selectively remove the sacrificial film 39, the electroconductive film 22m and the insulating film 35b, with the remaining portions left on the wires 21. As a result, a laminate 32 extending in the X-direction is formed on the regions right above the wires 21. In the laminate 32, the laminate 31 including the sacrificial film 39, the electroconductive film 22m and the insulating film 35b are arranged alternately along the X-direction. In this case, the laminate 31 and the insulating film 35b are each processed into a pillar shape extending in the Z-direction, while the wires 21 are left in the line shape extending in the X-direction.

Figure 26A:
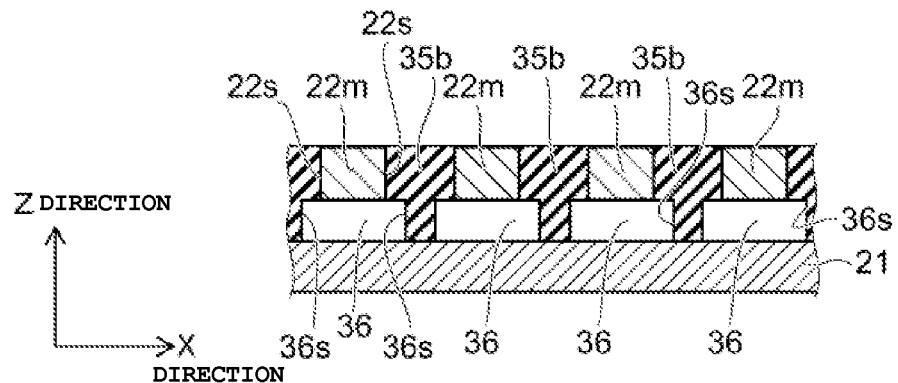
Figure 26B:
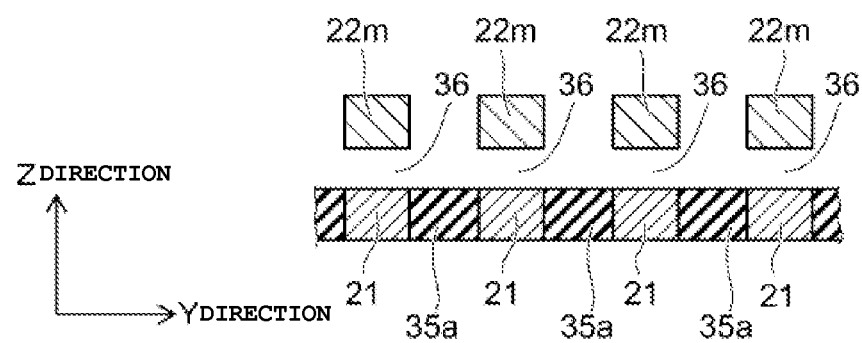

Then, as shown in FIG. 26A and FIG. 26B, wet etching is carried out using, for example, hydrogen fluoride (HF) as an etching solution to remove the sacrificial film 39 (see FIG. 25A and FIG. 25B). As a result, the cavity 36 is formed in the space after removal of the sacrificial film 39 in the operation. As a result, in the X-direction, the length of the sacrificial film 39 is longer than that of the electroconductive film 22m, and the length of cavity 36 is longer than the length of the electroconductive film 22m. This allows cavity 36 to expand to the two sides in the X-direction from the region right below the electroconductive film 22m, and the side surface 36s of cavity 36 is positioned on the outer side of the extended surface of the side surface 22s of the electroconductive film 22m. The insulating film 35b is arranged on both sides of cavity 36 in the X-direction.

Additionally, the wire 21 is arranged on the lower side of cavity 36, and the electroconductive film 22m is arranged on the upper side. The plural spaces wherein the sacrificial film 39 is arranged along the Y-direction are connected to each other. As a result, cavity 36 is connected to the outer side via the cavity between the adjacent electroconductive films 22m in the Y-direction. Also, the entirety of the side surface 22s of the electroconductive film 22m facing the X-direction is coated by the insulating film 35b, and the entirety of the side surface 21s of the wire 21 is coated by the insulating film 35a.

The later steps of operation are the same as those in the Embodiment 1.

Figure 27A:
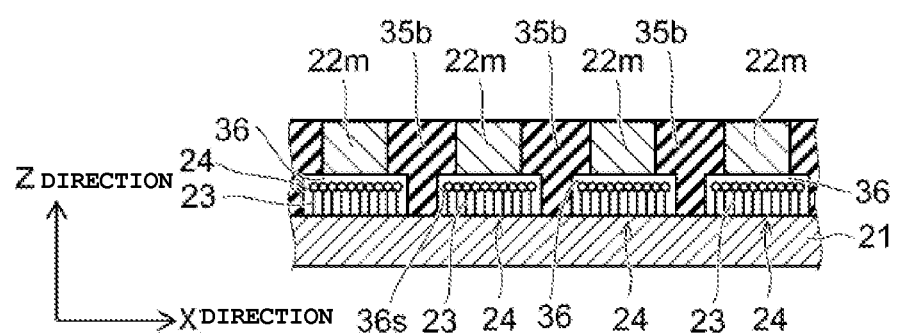
Figure 27B:
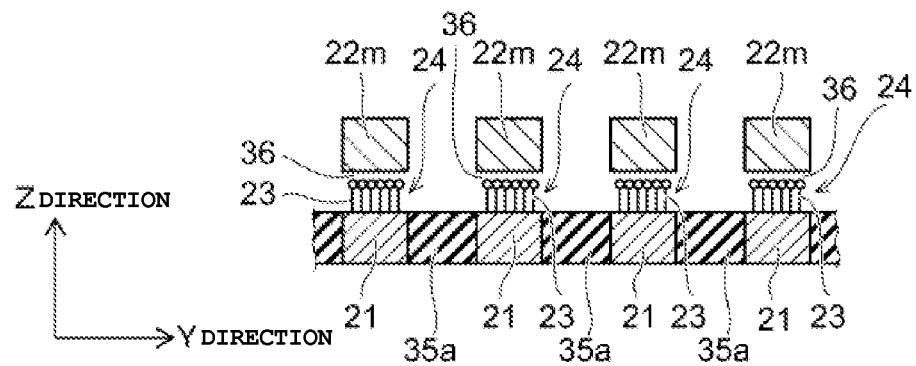

That is, as shown in FIG. 27A and FIG. 27B, the chemical solution containing the resistance varying-type molecular chains 23 is introduced into cavity 36, after which it is allowed to dry. As a result, one end portion of the resistance varying-type molecular chain 23 is bonded to the wire 21 made of tungsten, forming the storage molecular layer 24 in cavity 36. On the other hand, the resistance varying-type molecular chain 23 is not bonded to the electroconductive film 22m made of molybdenum. In addition, the resistance varying-type molecular chain 23 is not bonded to the insulating films 35a and 35b.

Figure 28A:
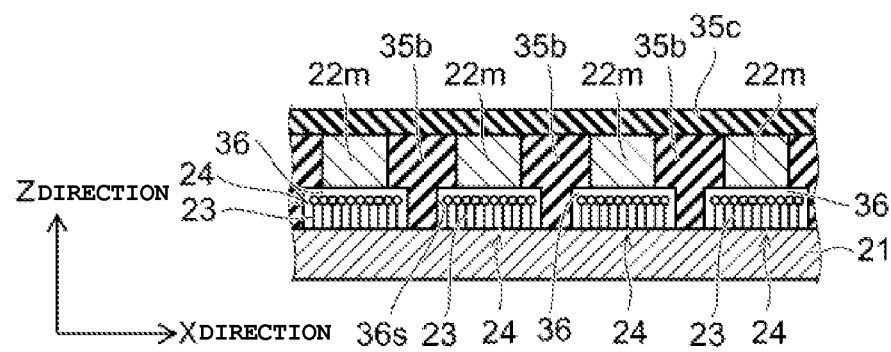
Figure 28B:
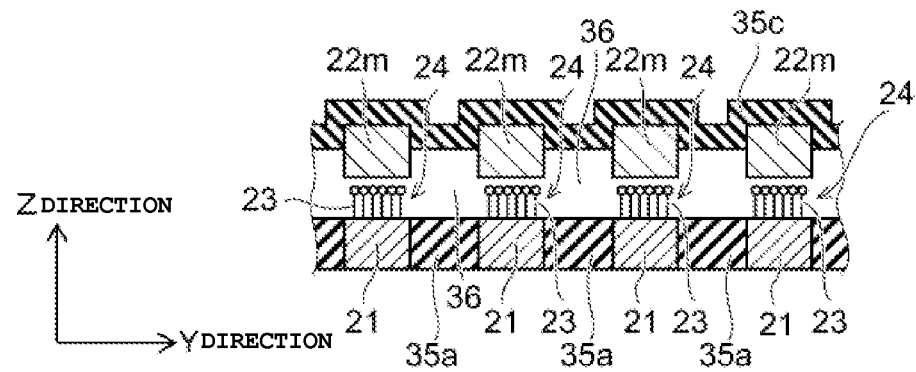

Then, as shown in FIG. 28A and FIG. 28B, an insulating material, such as silicon oxide (SiO2) or the like, is deposited using, for example, the CVD method under a condition with a low-embedding property. As a result, an insulating film 35c is formed between the electroconductive films 22m. In this case, cavity 36 is left as it is without being embedded by the insulating film 35c, and the upper portion of cavity 36 is sealed off by the insulating film 35c.

Figure 29A:
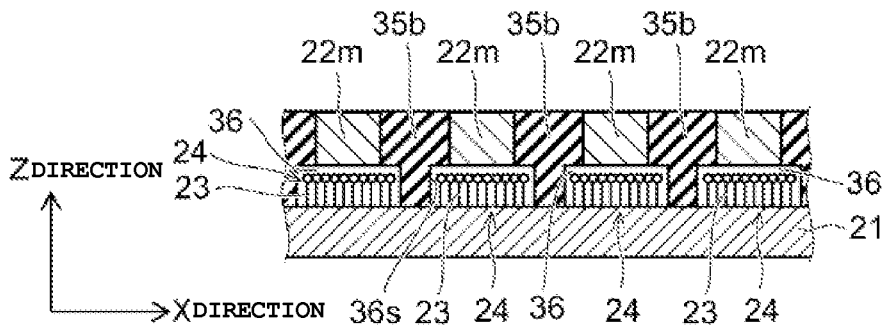
Figure 29B:
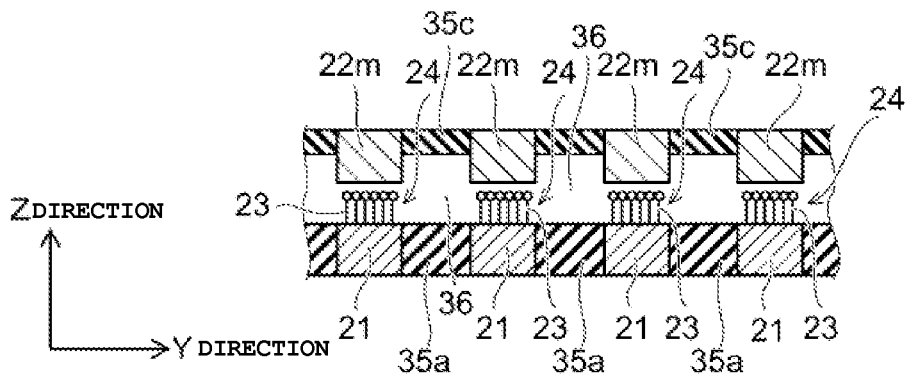

As shown in FIG. 29A and FIG. 29B, with the electroconductive film 22m used as a stopper, CMP or another flattening treatment is then carried out for the insulating film 35c.

Figure 30A:
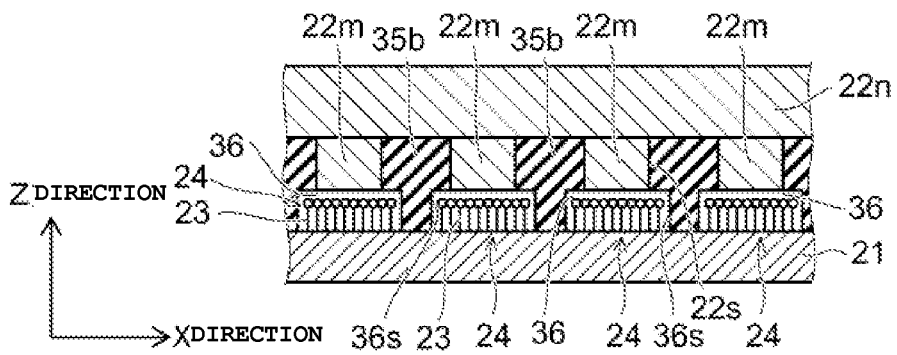
Figure 30B:
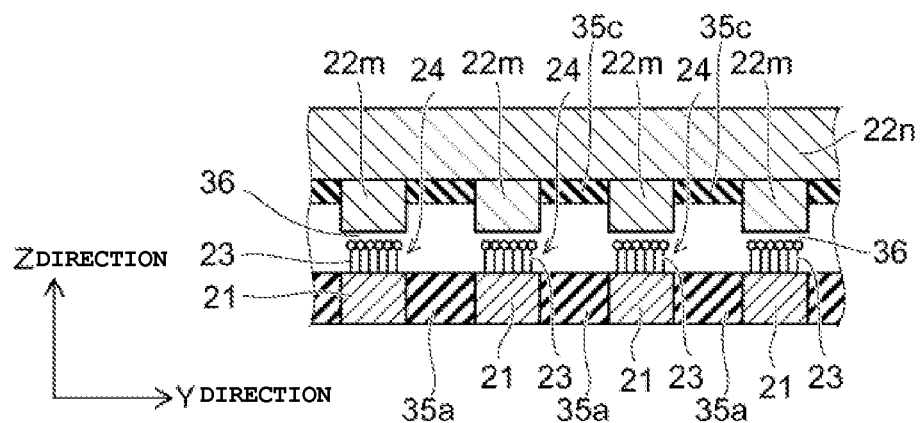

Subsequently, as shown in FIG. 30A and FIG. 30B, molybdenum is deposited to form an electroconductive film 22n on the entire surface. The electroconductive film 22n is in contact with the electroconductive film 22m.

Figure 31A:
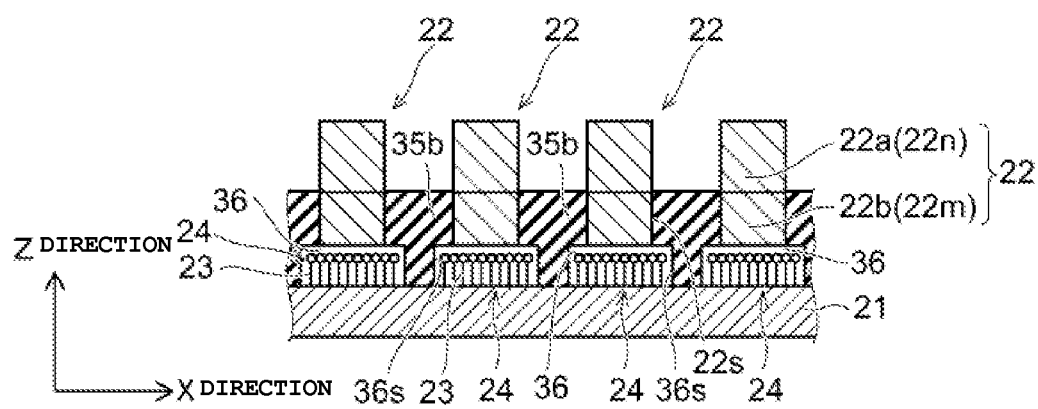
Figure 31B:
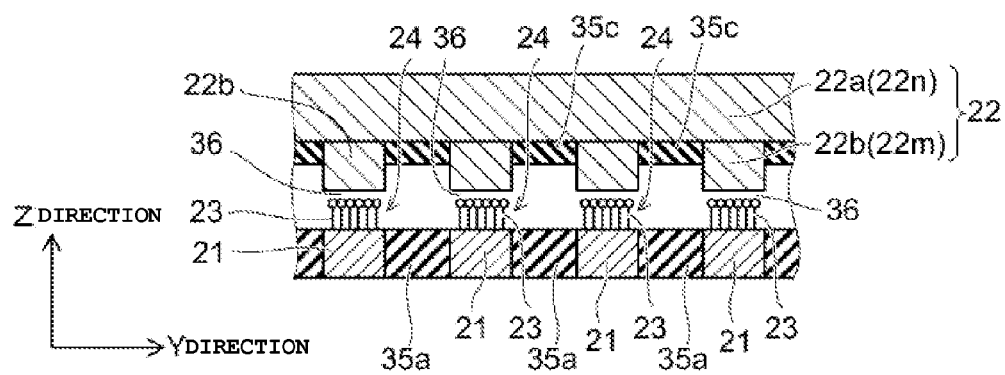

Then, as shown in FIG. 31A and FIG. 31B, lithography and etching are carried out to selectively remove the electroconductive film 22n to form an L/S-shaped pattern extending in the Y-direction. As a result, the wires 22 are formed from the electroconductive film 22m and the electroconductive film 22n.

As shown in FIG. 16A to FIG. 16C, an insulating material, such as organic SOG film, is then formed to create a passivation film 35d to coat the wires 22. Next, a portion of the passivation film 35d is removed to expose the pads (not shown in the figure) led out from the wires 21 and 22. As a result, the molecular memory 2 according to the present embodiment is manufactured. In the molecular memory 2, the insulating films 35a, 35b, 35c and the passivation film 35d form a portion of the interlayer insulating film 35.

In the following, the operation and effect of the present embodiment will be explained.

Figure 32:
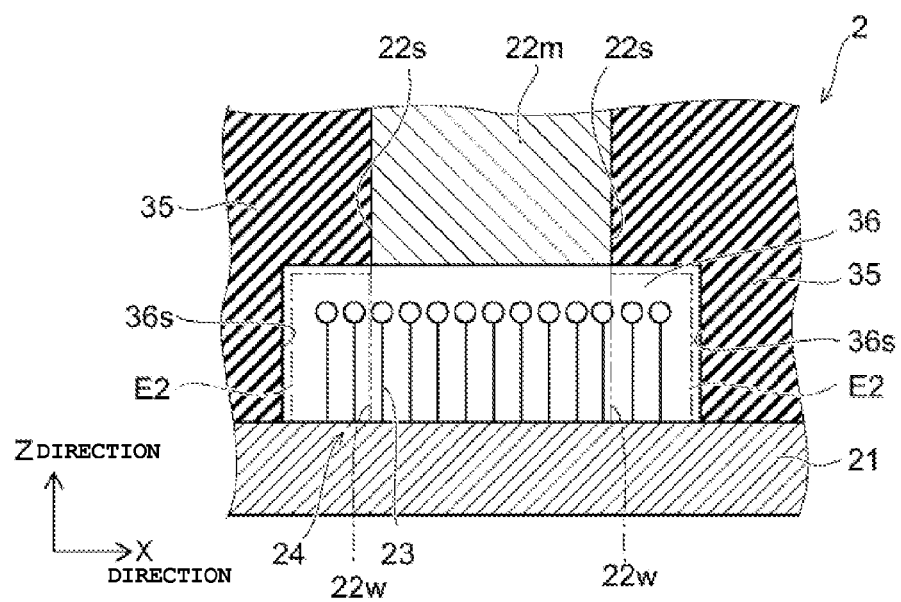
FIG. 32 is a diagram illustrating an operation and effects of a molecular memory according to a second embodiment.

FIG. 32 is a diagram illustrating the operation and effects of the second embodiment.

As shown in FIG. 32, for the molecular memory 2 according to the second embodiment, cavity 36 is formed in the region right below the protrusion portion 22b of the wire 22. A side surface 36s of cavity 36 is positioned on the outer side of the side surface 22s of the protrusion portion 22b of the wire 22 and its extended surface 22w. As a result, a length of a current path E2 along the surface of the interlayer insulating film 35 in between the wire 22 and the wire 21 is longer than that established when the side surface 36s of cavity 36 is in agreement with the extended surface 22w of the side surface 22s. As a result, in the molecular memory 2, the leakage current between the wire 22 and the wire 21 is low.

As shown in FIG. 16C, cavity 36 runs along the wire 22, and at the crossing portion between wire 21 and wire 22, there is no end surface parallel to the side surface of the wire 21. As a result, the leakage current is low.

In the following, Embodiment 3 will be explained.

Figure 33A:
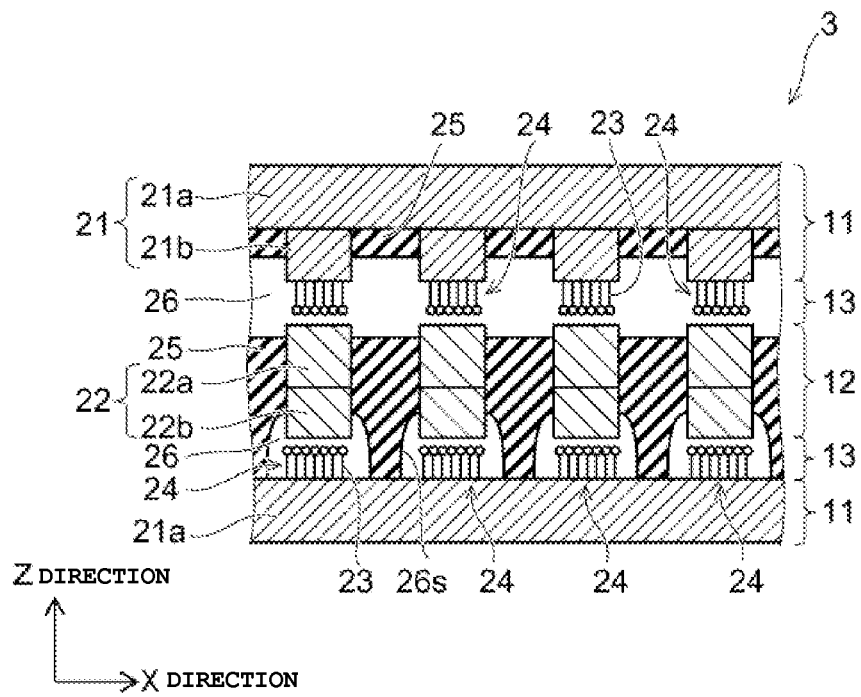
FIG. 33A and FIG. 33B are cross-sectional views illustrating an example of a molecular memory according to a third embodiment.
Figure 33B:
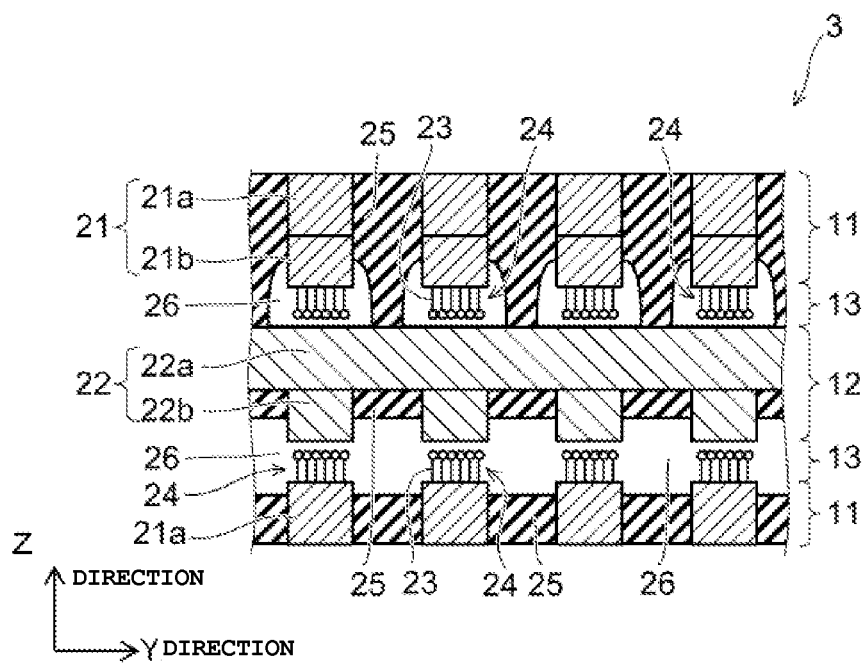

FIG. 33A and FIG. 33B are cross-sectional views illustrating an example of the molecular memory according to this third embodiment.

As shown in FIG. 33A and FIG. 33B, in the molecular memory 3 according to this third embodiment, plural wiring layers 11, plural storage layers 13 and plural wiring layers 12 are arranged. Here, the wiring layer 11 and the wiring layer 12 are laminated via the storage layer 13 alternately in the Z-direction. Specifically, the wiring layer 11, the storage layer 13, the wiring layer 12, the storage layer 13, the wiring layer 11, the storage layer 13, the wiring layer 12, ... are laminated in order. For this molecular memory 3, the steps of operation as shown in FIG. 3A and FIG. 3B to FIG. 14A and FIG. 14B are carried out repeatedly to manufacture the molecular memory. In this case, just as for the wire 22, a pillar-shaped protrusion portion 21b is formed below the protrusion portion 21a for the wire 21.

According to the third embodiment, wiring layer 11, wiring layer 12 and storage layer 13 are laminated from plural layers, so that it is possible to arrange the memory cells in the Z-direction. That is, it is possible to arrange the memory cells in the X-direction, the Y-direction and the Z-direction to form a three-dimensional matrix configuration. As a result, it is possible to increase the integration degree of the memory cells and, thus, to increase the recording density of the molecular memory.

The remaining features of the constitution, manufacturing method, operation and effects of the third embodiment other than the features described are the same as those in the Embodiment 1. That is, for the molecular memory 3 according to the third embodiment, the side surface of cavity 26 is arranged on the outer side of the side surface of the wire 22, and in the memory cell portion, there is no end surface parallel to the side surface of the wire 21. Consequently, the current path along the surface of the interlayer insulating film 25 is longer, and the leakage current is lower.

Similar to the third embodiment, the molecular memory 2 according to the Embodiment 2 also allows laminating in the Z-direction. Such molecular memory can be manufactured by carrying out the steps of operation shown in FIG. 16A and FIG. 16B to FIG. 31A and FIG. 31B repeatedly.

Figure 34:
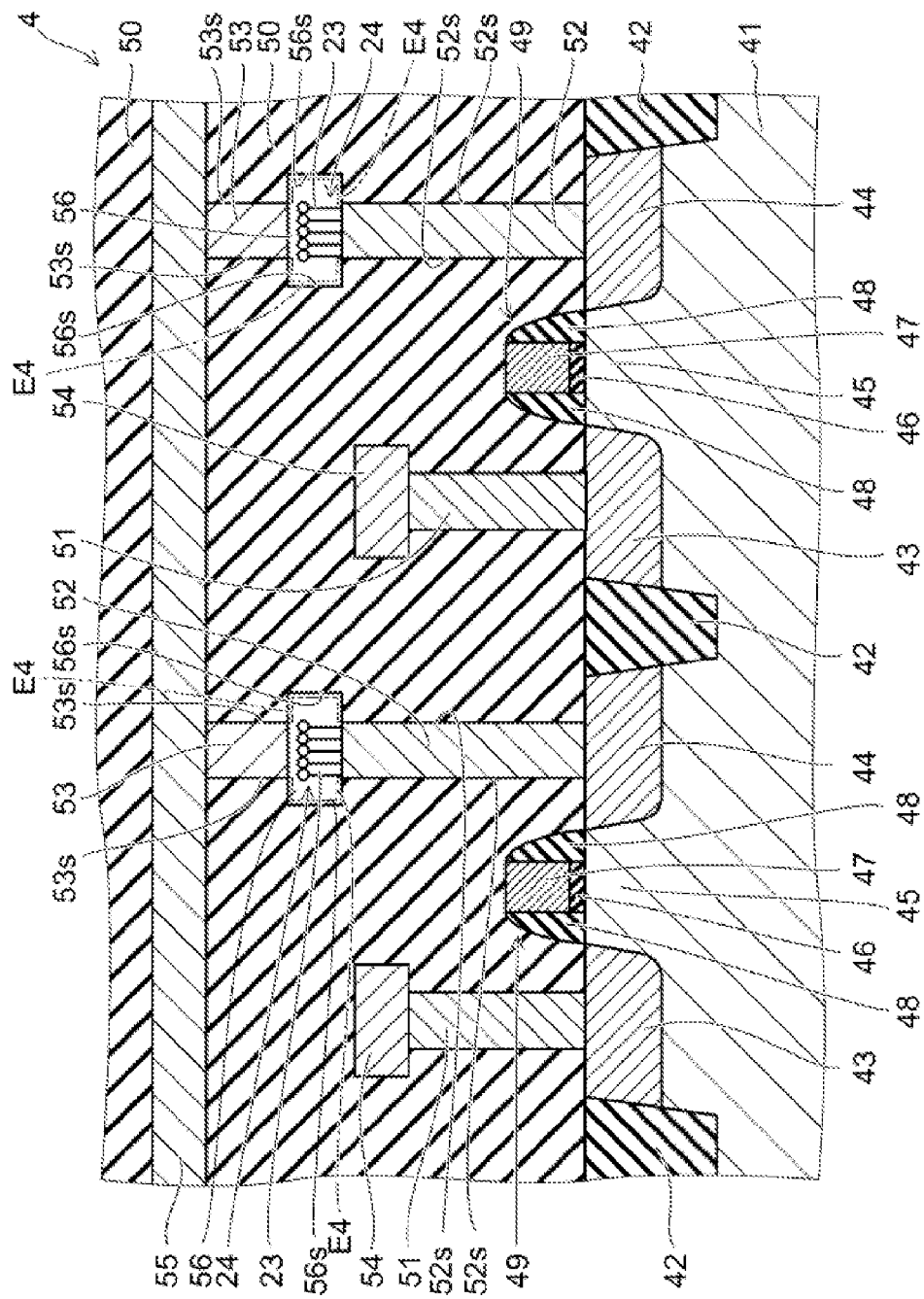
FIG. 34 is a cross-sectional view illustrating an example of a molecular memory according to a fourth embodiment.

In the following, Embodiment 4 will be explained. FIG. 34 is a cross-sectional view illustrating an example of the molecular memory according to the fourth embodiment.

Figure 35:
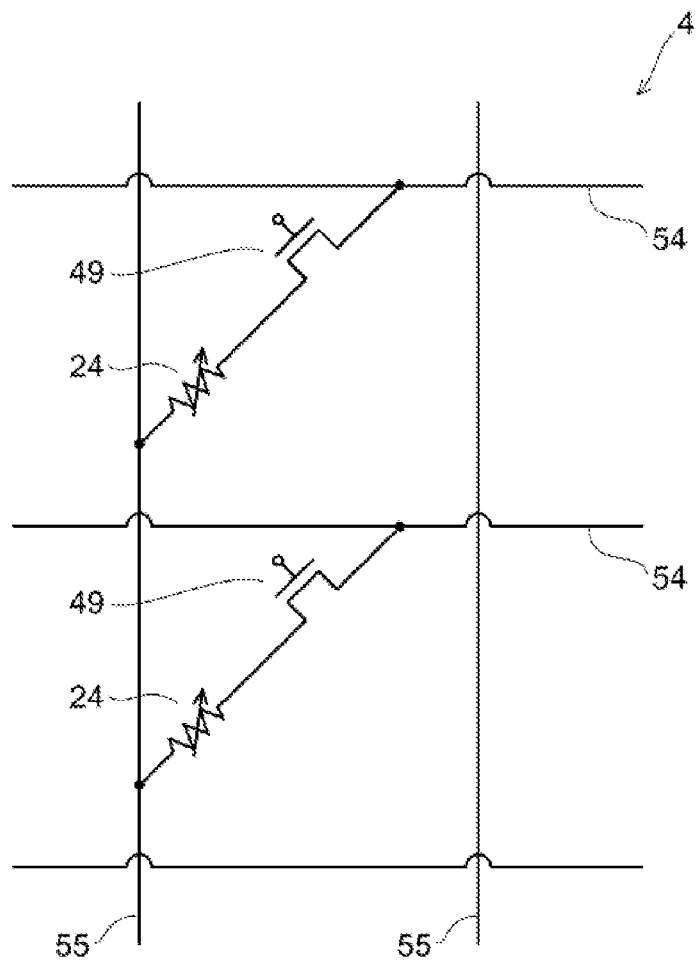
FIG. 35 is a circuit diagram illustrating an example of the molecular memory according a fourth embodiment.

FIG. 35 is a circuit diagram illustrating an example of the molecular memory according to the fourth embodiment.

As shown in FIG. 34, in the molecular memory 4 according to the fourth embodiment, an element separating insulating member 42 is formed in the upper layer portion of a silicon substrate 41, and in the regions divided by an element separating insulating member 42, a source region 43 and a drain region 44 are separated from each other. On the silicon substrate 41, a gate-insulating film 46 is arranged on the region right above the channel region 45 between the source region 43 and the drain region 44. On the gate-insulating film, a gate electrode 47 is formed. On the side of the gate electrode 47, a side wall 48 is arranged. As a result, a field effect transistor 49 is formed.

On the silicon substrate 41, an interlayer insulating film 50 is arranged. Inside the interlayer insulating film 50, the following parts are arranged: a contact 51, a contact 52, a contact 53, a word line 54 and a bit line 55. Here, the contact 52 is made of tungsten, while the contact 53 is made of molybdenum. In the interlayer insulating film 50, cavity 56 is formed between the contact 52 and the contact 53.

The contact 51 is connected between the source region 43 and the word line 54. The lower surface of the contact 52 is connected to the drain region 44, and the upper surface is exposed on the lower surface of cavity 56. The contact 53 is arranged in the region right above the contact 52, and it is separated from the contact 52 via the cavity 56. The lower surface of the contact 53 is exposed on the upper surface of the cavity 56, and its upper surface is connected to the bit line 55. Then, cavity 56 is positioned in the region right below the contact 53. A side surface 56s of the cavity 56 is arranged on the outer side of the extended surface of a side surface 53s of the contact 53 and the extended surface of a side surface 52s of the contact 52. The resistance varying-type molecular chain 23 is arranged in cavity 56, and it is bonded with the contact 52. With plural resistance varying-type molecular chains 23, a storage molecular layer 24 is formed.

As a result, as shown in FIG. 35, in the molecular memory 4, 1R1T-type memory cells are formed, each with a storage molecular layer 24 working as a storage element and a field effect transistor 49 working as a selecting element connected in tandem between the word line 54 and the bit line 55.

According to the present embodiment, similar to the Embodiments 1 to 3, a length of a current path E4 along the surface of the interlayer insulating film 50 between the contact 52 and the contact 53 is longer, so that it is possible to suppress the leakage current between the contact 52 and the contact 53.

In addition, one may also adopt a scheme in which either one of the lower portion of the side surface 53s of the contact 53 or the upper portion of the side surface 52s of the contact 52 is exposed to the interior of cavity 56. As a result, the current path along the surface of the interlayer insulating film 50 becomes even longer, so that it is possible to further decrease the leakage current.

In the following, Embodiment 5 will be explained.

Figure 36A:
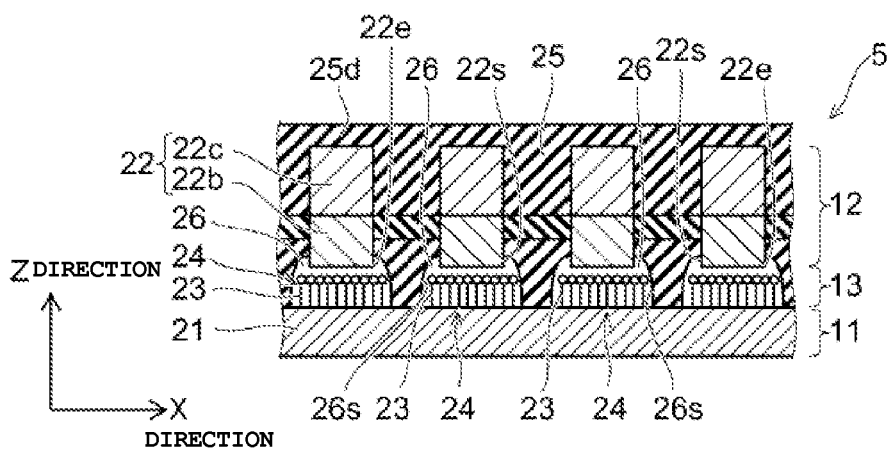
FIG. 36A and FIG. 36B are cross-sectional views illustrating an example of a molecular memory according to a fifth embodiment.
Figure 36B:
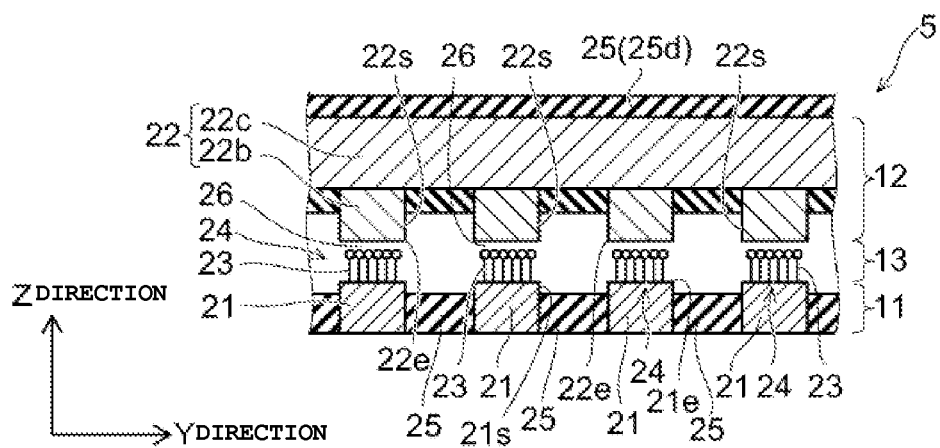
Figure 36C:
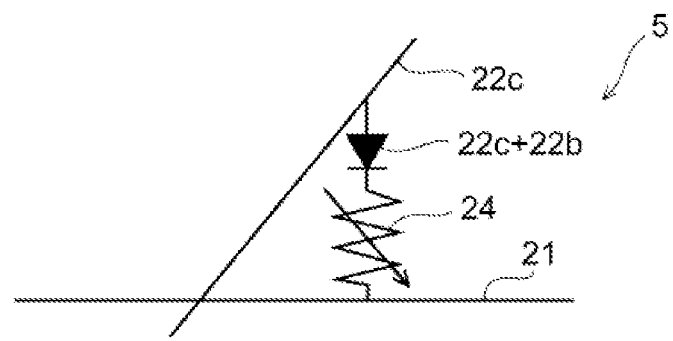
FIG. 36C is a circuit diagram illustrating an example of the molecular memory according a fifth embodiment.

FIG. 36A and FIG. 36B are cross-sectional views illustrating an example of the molecular memory according to this embodiment. FIG. 36C is a circuit diagram.

As shown in FIG. 36A and FIG. 36B, different from the molecular memory 1 in the Embodiment 1 (see FIG. 1A to FIG. 1C), a molecular memory 5 according to this embodiment has a main body portion 22c instead of the main body portion 22a of the wires 22 (see FIG. 1C). While the main body portion 22a in Embodiment 1 is made of molybdenum (Mo), the main body portion 22c in this embodiment is made of an N-type silicon (Si) or another semiconductor material. In addition, similar to the Embodiment 1, the protrusion portion 22b of the wire 22 is made of molybdenum. The molecular memory 5 in this embodiment can be manufactured by forming the electroconductive film 22n (see FIG. 13A) from an N-type silicon in the manufacturing method the same as that according to Embodiment 1 or Embodiment 2.

In the molecular memory 5 according to the present embodiment, a Schottky diode is formed from the main body portion 22c made of an N-type silicon and the protrusion portion 22b made of molybdenum. As a result, it is possible to separate the diode from the storage molecular layer 24. Consequently, as shown in FIG. 36C, between the wire 21 and the wire 22, it is possible to realize a memory cell having a variable resistor element (storage molecular layer 24) and a diode (main body portion 22c and protrusion portion 22b) connected in tandem between the wire 21 and the wire 22. This embodiment is especially effective when it is impossible to realize the rectifying property by a combination of the wire 21 and wire 22 and storage molecular layer 24. The features of this embodiment excluding the constitution, operation and effect are the same as those of Embodiment 1.

In the following, a modified example of the materials adopted in the embodiments will be explained.

Figure 37:
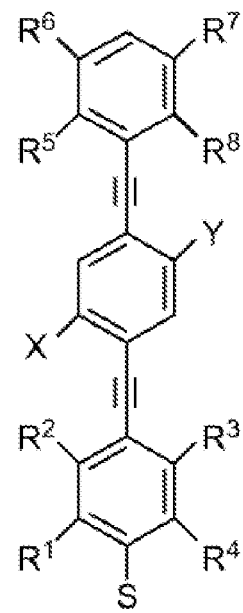
FIG. 37 is a diagram illustrating an example of a general chemical formula of a resistance varying-type molecular chain according to a modified example.

FIG. 37 is a diagram illustrating an example of the general formula of a resistance varying-type molecular chain according to the modified example.

FIG. 38A to FIG. 38F are diagrams illustrating an example of a molecular unit that can form the molecule with the π conjugated system stretching in the one-dimensional direction.

In the embodiments, as an example, the resistance varying-type molecular chain 23 is made of 4-[2-amino-5-nitro-4-(phenylethynyl)phenylethynyl]benzenethiol as shown in FIG. 2. However, the present disclosure is not limited to this example. The resistance varying-type molecular chain 23 may be any molecule as long as it has the function of varying resistance. For example, as indicated by the general formula shown in FIG. 37, the resistance varying-type molecular chain 23 may also be a derivative of 4-[2-amino-5-nitro-4-(phenylethynyl)phenylethynyl]benzenethiol.

In addition, in the general formula shown in FIG. 37, the combination of X and Y may include any two of the following groups: fluorine (F), chlorine (Cl), bromine (Br), iodine (I), cyano group (CN), nitro group (NO2), amino group (NH2), hydroxyl group (OH), carbonyl group (CO) and carboxy group (COOH). In addition, Rn (n=1 to 8) may be any atoms except those having outer shell electrons of d-electrons or f-electrons. Rn (n=1 to 8) may also be characteristic groups, such as hydrogen (H), fluorine (F), chlorine (Cl), bromine (Br), iodine (I), and methyl group (CH3).

Also, the resistance varying-type molecular chain 23 may be a molecule having a π-conjugated system stretching in the one-dimensional direction and other than the molecular structure represented by the general formula shown in FIG. 37. Examples include para-phenylene derivatives, oligo-thiophene derivatives, oligo-pyrrole derivatives, oligo-furan derivatives and para-phenylene vinylene derivatives.

Figure 38A:
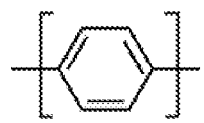
FIG. 38A to FIG. 38F are diagrams illustrating an example of the molecular unit that can form a molecule with a it conjugated system stretching in a one-dimensional direction.
Figure 38B:
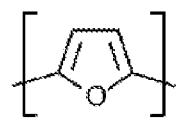
Figure 38C:
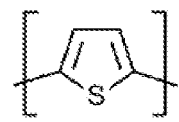
Figure 38D:
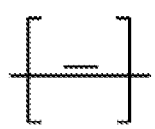
Figure 38E:
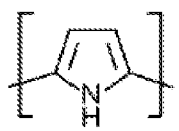
Figure 38F:
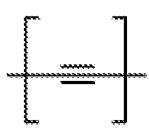

The molecular unit that can form the molecule with the π-conjugated system stretching in one-dimensional direction may be the para-phenylene shown in FIG. 38A, the furan shown in FIG. 38B, the thiophene shown in FIG. 38C, the alkene shown in FIG. 38D, the pyrrole shown in FIG. 38E or the alkyne shown in FIG. 38F. In addition, one may also use pyridine or other heterocyclic 6-member compounds.

When a length of the π-conjugated system is short, the electrons injected from the electrode are not kept on the molecule; instead, they are extracted out. Consequently, in order to accumulate the electric charge, it is preferred that the molecules have a certain length. When computation is made on —CH=CH— unit in a one-dimensional direction, 5 or more such units are preferred. When benzene rings (e.g., para-phenylene) are adopted, this distance corresponds to 3 or more rings. The diameter of the benzene ring is about twice the expansion width of the polaron as the carrier of the π conjugated system. On the other hand, when the π conjugated system is too long, decrease in voltage due to conduction of the electric charge in the molecule becomes a problem. Consequently, it is preferred that the length of the it conjugated system be shorter than that of 20 or less when computation is made on —CH=CH— unit in a one-dimensional direction. This corresponds to 10 or less benzene rings.

In the embodiments, as an example, the wire 21 or contact 52 is made of tungsten, while the wire 22 or contact 53 is made of molybdenum. However, the present disclosure is not limited to this scheme. The electroconductive material preferable for forming the wires and contacts depends on the molecular structure of one end portion of the resistance varying-type molecular chain 23.

For example, as shown in FIG. 2, when one end portion of the resistance varying-type molecular chain 23 is a thiol group, as the material of the wire 21 and the contact 52 (that is, as the material to form chemical bonds with the resistance varying-type molecular chain 23), in addition to the tungsten (W), the following materials are also preferred: gold (Au), silver (Ag), copper (Cu), tungsten nitride (WN), tantalum nitride (TaN) and titanium nitride (TiN). Among them, tungsten (W), gold (Au) and silver (Ag) are especially preferred, as they easily form a chemical bond in this case. On the other hand, as the material for the wire 22 and contact 53 (that is, the material for the portion not desired to form chemical bonds with the resistance varying-type molecular chain 23), in addition to the molybdenum, the following types are also preferred: tantalum (Ta), molybdenum nitride (MoN), and silicon (Si).

When one end portion of the resistance varying-type molecular chain 23 is an alcohol group or a carboxyl group, the following materials for the portion that can easily form chemical bonds with the resistance varying-type molecular chain 23 are preferred: tungsten (W), tungsten nitride (WN), tantalum (Ta), tantalum nitride (TaN), molybdenum (Mo), molybdenum nitride (MoN) and titanium nitride (TiN). Among them, the following types that can easily form the chemical bonds are more preferable: tantalum (Ta), tantalum nitride (TaN), molybdenum nitride (MoN) and titanium nitride (TiN). On the other hand, as the materials for the portion that is not desired to form chemical bonds with the resistance varying-type molecular chain 23 as easily, gold (Au), silver (Ag), copper (Cu) and silicon (Si) are preferred.

In addition, when the one end portion of the resistance varying-type molecular chain 23 includes a silanol group, it is preferred that the material of the portion desired to make chemical bond with the resistance varying-type molecular chain 23 be silicon (Si) or metal oxide. On the other hand, the material of the portion that is not desired to form a chemical bond with the resistance varying-type molecular chain 23 is preferably gold (Au), silver (Ag), copper (Cu), tungsten (W), tungsten nitride (WN), tantalum (Ta), tantalum nitride (TaN), molybdenum (Mo), molybdenum nitride (MoN) and titanium nitride (TiN).

Generally speaking, examples of the electroconductive materials for forming the wire 21, wire 22, contact 52 and contact 53 include the following types of metals: gold (Au), iridium (Ir), palladium (Pd), nickel (Ni), platinum (Pt), copper (Cu), cobalt (Co), germanium (Ge), rhodium (Rh), molybdenum (Mo), chromium (Cr), niobium (Nb), iron (Fe), tantalum (Ta), rhenium (Re), ruthenium (Ru), antimony (Sb), tungsten (W), tin (Sn), bismuth (Bi), titanium (Ti), calcium (Ca), vanadium (V), lead (Pb), manganese (Mn), cadmium (Cd), zinc (Zn), hafnium (Hf), thallium (Tl), magnesium (Mg) and scandium (Sc), which may be used either alone or as a mixture of two or more types. When the wiring or contacts are made of compounds, the composition of the compound can be selected appropriately. In addition, as the materials for wiring and contacts, for example, grapheme or carbon nanotubes may be adopted as well. However, the materials for the wiring and contacts are not limited to these materials and those skilled in the art will be able to pair various metal and alloys for wiring and contacts with appropriate reactive groups on the resistance varying-type molecule.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A molecular memory device, comprising:
   an insulating film having a plurality of cavities arranged along a first direction, the plurality of cavities including a cavity that extends along a second direction that intersects the first direction and has an upper portion and a lower portion;
   a first conductive member having an upper surface exposed at the lower portion of the cavity;
   a second conductive member having a lower surface exposed at the upper portion of the cavity; and
   a resistance varying-type molecular chain disposed in the cavity and bonded to either the first conductive member or the second conductive member,
       wherein the cavity is wider along the first direction than the second conductive member.

2. The molecular memory device of claim 1, wherein the second conductive member includes:
   a main body portion; and
   a protrusion portion above the first conductive member, the protrusion portion having a lower surface and a side surface and protruding from the main body portion towards the first conductive member, the lower surface of the protrusion portion exposed at the upper surface of the cavity.

3. The molecular memory device of claim 2, wherein a portion of the side surface of the protrusion portion is exposed at the upper portion of the cavity.

4. The molecular memory device of claim 2, wherein the main body portion of the second conductive member does not comprise a material of the second conductive member.

5. The molecular memory device of claim 4, wherein the main body portion of the second conductive member comprises a semiconductor material.

6. The molecular memory device of claim 2, wherein the first conductive member comprises tungsten, and the protrusion portion of the second conductive member comprises molybdenum.

7. The molecular memory device of claim 1, wherein the first conductive member has a side surface and a portion of the side surface is exposed at the lower portion of the cavity.

8. The molecular memory device of claim 1, wherein the upper portion of the cavity is approximately perpendicular to a sidewall of the cavity.

9. The molecular memory device of claim 1, wherein a sidewall of the cavity has a curved shape.

10. The molecular memory device of claim 1, further comprising:
    a plurality of first conductive members arrayed at a first regular interval in the second direction; and
    a plurality of second conductive members extending in the second direction, the plurality arrayed in the first direction at a second regular interval.

11. The molecular memory device of claim 10, wherein the plurality of first conductive members are further arrayed in a third direction, orthogonal to both the first and second direction.

12. The molecular memory device of claim 1, wherein the first conductive member comprises tungsten and the second conductive member comprises molybdenum.

13. The molecular memory device of claim 1, wherein the resistance varying-type molecular chain is 4-[2-amino-5-nitro-4-(phenylethynyl)phenylethynyl]benzenethiol.

14. The molecular memory device of claim 1, wherein the resistance varying-type molecular chain comprises a π-conjugated system extending a single direction.

15. The molecular memory device of claim 1, further comprising:
    a gate electrode above a gate insulating film, the gate insulating film disposed on a surface between a source region and a drain region;
    wherein, the first conductive member contacts the drain region.

16. A molecular memory device, comprising:
    an insulating film having a plurality of cavities arranged along a first direction, the plurality of cavities including a cavity that extends along a second direction that intersects the first direction and has an upper portion and a lower portion;
    a first conductive member comprising a first conductive material, the first conductive member extending in the first direction and having a portion exposed at the lower portion of the cavity;
    a second conductive member comprising a second conductive material different from the first conductive material, the second conductive member extending in the second direction and having a portion exposed at the upper portion of the cavity; and a resistance varying-type molecular chain arranged in the cavity and bonded with the first conductive member or the second conductive member, wherein the cavity is wider along the first direction than the second conductive member.

17. The molecular memory device of claim 16, wherein the second conductive member comprises:

a main body portion extending in the second direction; and a protrusion portion above the first wiring and protruding from the main body portion towards the first wiring, the protrusion portion exposed at the upper portion of the cavity.

18. The molecular memory device of claim 17, wherein the first conductive member has a side surface which is fully coated with the insulating material, such that only an upper surface the first conductive member is the portion exposed at the lower portion of the cavity.

* * * * *